US012772707B2

(12) United States Patent
Li et al.

(10) Patent No.: US 12,772,707 B2
(45) Date of Patent: Oct. 20, 2026

(54) DISPLAY DEVICE, DISPLAY PANEL AND MANUFACTURING METHOD THEREOF

(71) Applicants: Chengdu BOE Optoelectronics Technology Co., Ltd., Sichuan (CN); BOE Technology Group Co., Ltd., Beijing (CN)

(72) Inventors: Ruoxiang Li, Beijing (CN); Qian Chen, Beijing (CN); Liang Xia, Beijing (CN); Chenbiao Yang, Beijing (CN); Lu Li, Beijing (CN); Yao Hu, Beijing (CN); Qifu Ran, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 461 days.

(21) Appl. No.: 18/262,196

(22) PCT Filed: Apr. 24, 2022

(86) PCT No.: PCT/CN2022/088837

§ 371 (c)(1),
(2) Date: Jul. 20, 2023

(87) PCT Pub. No.: WO2023/205966

PCT Pub. Date: Nov. 2, 2023

(65) Prior Publication Data

US 2024/0397798 A1 Nov. 28, 2024

(51) Int. Cl.
*H10K 59/80* (2023.01)
*G06F 3/041* (2006.01)
(Continued)

(52) U.S. Cl.
CPC ......... *H10K 59/879* (2023.02); *G06F 3/0412* (2013.01); *H10K 59/122* (2023.02);
(Continued)

(58) Field of Classification Search
CPC .... H10K 59/879; H10K 59/40; H10K 59/122; H10K 59/38; H10K 59/8792;
(Continued)

(56) References Cited

U.S. PATENT DOCUMENTS 8,963,138 B2 2/2015 Jae-Ik et al.
9,142,802 B2 9/2015 Mitsuhide et al.
(Continued)

FOREIGN PATENT DOCUMENTS

CN 209785979 U 12/2019
CN 110764169 A 2/2020
(Continued)

OTHER PUBLICATIONS

Extended European Search Report of application No. 22938825.1 dated Nov. 12, 2024.

(Continued)

*Primary Examiner* — Joseph L Williams
*Assistant Examiner* — Hana S Featherly
(74) *Attorney, Agent, or Firm* — Calfee, Halter & Griswold LLP

(57) ABSTRACT

There is provided a display device, a display panel and a manufacturing method thereof. The display panel includes a driving backplane, a light-emitting layer, a first inorganic layer, a lens layer, an organic layer and a second inorganic layer. The light-emitting layer is arranged on a side of the driving backplane and includes a pixel definition layer and light-emitting devices. The first inorganic layer covers the light-emitting layer. The lens layer is arranged on a surface of the first inorganic layer away from the driving backplane,
(Continued)

and includes lenses arranged as corresponding to the light-emitting devices. The organic layer covers the lens layer. A refractive index of the organic layer is smaller than a refractive index of the first inorganic layer and smaller than a refractive index of the lenses. The second inorganic layer covers the organic layer.

20 Claims, 12 Drawing Sheets

(51) Int. Cl.

| | |
|---|---|
| ***G06F 3/044*** | (2006.01) |
| ***H10K 59/122*** | (2023.01) |
| ***H10K 59/38*** | (2023.01) |
| ***H10K 59/40*** | (2023.01) |

(52) U.S. Cl.
CPC ............. *H10K 59/38* (2023.02); *H10K 59/40* (2023.02); *H10K 59/8792* (2023.02); *G06F 3/0446* (2019.05); *G06F 2203/04111* (2013.01); *G06F 2203/04112* (2013.01)

(58) Field of Classification Search
CPC ................. G06F 3/0412; G06F 3/0446; G06F 2203/04111; G06F 2203/04112
USPC .......................................................... 313/500
See application file for complete search history.

(56) References Cited

U.S. PATENT DOCUMENTS

| | | | |
|---|---|---|---|
| 2014/0027724 A1 | 1/2014 | Jae-Ik et al. | |
| 2015/0084026 A1 | 3/2015 | Mitsuhide et al. | |
| 2015/0333108 A1 | 11/2015 | Mitsuhide et al. | |
| 2019/0165053 A1* | 5/2019 | Park | H10K 59/8731 |
| 2019/0221779 A1 | 7/2019 | Jang et al. | |
| 2019/0260963 A1 | 8/2019 | Guo et al. | |
| 2020/0358035 A1* | 11/2020 | Yokoyama | H10K 59/353 |
| 2020/0388790 A1 | 12/2020 | Yamazaki et al. | |
| 2021/0004126 A1* | 1/2021 | Jang | G06F 3/0443 |
| 2022/0102457 A1 | 3/2022 | Du et al. | |

FOREIGN PATENT DOCUMENTS

| | | | |
|---|---|---|---|
| CN | 111599850 | A | 8/2020 |
| CN | 112382648 | A | 2/2021 |
| CN | 215600394 | U | 1/2022 |
| CN | 114005861 | A | 2/2022 |
| CN | 114023903 | A | 2/2022 |
| JP | 2012216454 | A | 11/2012 |
| JP | 2020201484 | A | 12/2020 |
| JP | 2021118358 | A | 8/2021 |
| KR | 20200094548 | A | 8/2020 |
| KR | 20210081603 | A | 7/2021 |
| WO | 2020080022 | A1 | 4/2020 |
| WO | 2021228219 | A1 | 11/2021 |

OTHER PUBLICATIONS

Written Opinion from PCT/CN2022/088837 dated Nov. 23, 2022.

International Search Report from PCT/CN2022/088837 dated Nov. 23, 2022.

First Office Action of IN application No. 202417041134 dated Mar. 13, 2026.

First Office Action of JP application No. 2024-529996 dated Apr. 14, 2026.

* cited by examiner

DISPLAY DEVICE, DISPLAY PANEL AND MANUFACTURING METHOD THEREOF

CROSS REFERENCE

The present application is a 371 application of PCT Application No. PCT/CN2022/088837, filed on Apr. 24, 2022, the entire contents of which are incorporated herein by reference.

TECHNICAL FIELD

The present disclosure relates to the display technical field, and in particular, to a display device, a display panel and a method for manufacturing the display panel.

BACKGROUND

A display panel is an indispensable part of an electronic device, such as mobile phone, or computer. Display panels include liquid crystal display panels, organic electroluminescent display panels, and the like. At present, people have increasingly high requirements for display effects, but the brightness of existing display panels still needs to be improved, and display abnormalities such as color shift are prone to occur.

It should be noted that the information disclosed in the background section above is only used to enhance the understanding of the background of the present disclosure, and therefore may include information that does not constitute the prior art known to those skilled in the art.

SUMMARY

The present disclosure provides a display device, a display panel and a method for manufacturing the display panel.

According to an aspect of the present disclosure, there is provided a display panel, including:

a driving backplane;

a light-emitting layer arranged on a side of the driving backplane and including a pixel definition layer and a plurality of light-emitting devices, wherein the pixel definition layer has a plurality of openings, and one of the light-emitting devices is defined in one of the openings;

a first inorganic layer covering the light-emitting layer;

a lens layer arranged on a surface of the first inorganic layer away from the driving backplane, and including a plurality of lenses, wherein one of the lenses and one of the light-emitting devices are arranged correspondingly;

an organic layer covering the lens layer and the first inorganic layer, wherein a refractive index of the organic layer is smaller than a refractive index of the first inorganic layer and smaller than a refractive index of the lenses; and a second inorganic layer covering the organic layer.

In an example embodiment of the present disclosure, the display panel further includes:

a filter layer covering the lens layer and including a plurality of filter units distributed in an array, wherein any one of at least a part of the lenses is covered by one of the filter units, each of the filter units only allows monochromatic light to pass through, and colors of monochromatic light passing through at least two of the filter units are different, and a refractive index of the filter layer is smaller than a refractive index of a lens which is covered by the filter layer.

In an example embodiment of the present disclosure, the refractive index of the organic layer is the same as the refractive index of the filter layer.

In an example embodiment of the present disclosure, at least a part of the lenses only allow monochromatic light to pass through, and colors of monochromatic light passing through at least two of the lenses are different, and the refractive index of the organic layer is smaller than the refractive index of the lenses.

In an example embodiment of the present disclosure, the refractive index of the lens is the same as the refractive index of the first inorganic layer.

In an example embodiment of the present disclosure, the first inorganic layer is recessed at the openings to form recesses, and each of the lenses includes a filling portion filling one of the recesses and a protrusion portion protruding from the one of the recesses.

In an example embodiment of the present disclosure, the protrusion portion has a top surface and an outer peripheral surface surrounding the top surface, and the outer peripheral surface is connected between the top surface and the filling portion;

wherein in one of the lenses and a recess which the one of the lenses fills, an orthographic projection of an opening corresponding to the recess on the driving backplane is located within an orthographic projection of the top surface on the driving backplane, the outer periphery surface shrinks in a direction away from the driving backplane, and an orthographic projection of the outer peripheral surface on the driving backplane surrounds outside of the orthographic projection of the opening corresponding to the recess on the driving backplane.

In an example embodiment of the present disclosure, the outer peripheral surface is formed by a plurality of surrounding planes, and each of the planes is an inclined slope, and a slope angle of each of the planes is not greater than 90°.

In an example embodiment of the present disclosure, the display panel further includes:

a light-absorbing layer arranged on a same side of the driving backplane as the light-emitting devices, wherein an orthographic projection of the light-absorbing layer on the driving backplane separates orthographic projections of the lenses on the driving backplane.

In an example embodiment of the present disclosure, the display panel includes a display area and a peripheral area located outside the display area, the display area has a sub-display area and a main display area located outside the sub-display area, the light-emitting devices are distributed in the main display area and the sub-display area, and the light-absorbing layer is located in the main display area.

In an example embodiment of the present disclosure, the display panel includes a display area and a peripheral area located outside the display area, the display area has a sub-display area and a main display area located outside the sub-display area, and the light-emitting devices are distributed in the main display area and the sub-display area;

wherein the display panel further includes:

the light-absorbing layer arranged in the main display area and the sub-display area, wherein the light-absorbing layer is provided with a plurality of light transmission holes located in the sub-display area.

In an example embodiment of the present disclosure, the display panel further includes:

a light-absorbing layer arranged on a surface of the first inorganic layer away from the driving backplane;

wherein at least a part of the filter units are arranged on a surface of the light-absorbing layer away from the driving backplane and cover the lenses.

In an example embodiment of the present disclosure, at least a part of the pixel definition layer is made of a light-absorbing material.

In an example embodiment of the present disclosure, the display panel includes a display area and a peripheral area located outside the display area, the display area has a sub-display area and a main display area located outside the sub-display area, and the light-emitting devices are distributed in the main display area and the sub-display area;

wherein the pixel definition layer in the sub-display area is made of a light-transmitting material, and the pixel definition layer in the main display area is made of the light-absorbing material.

In an example embodiment of the present disclosure, the display panel includes a display area and a peripheral area located outside the display area, the display area has a sub-display area and a main display area located outside the sub-display area, and the light-emitting devices are distributed in the main display area and the sub-display area;

wherein the pixel definition layer is made of the light-absorbing material, and the pixel definition layer in the sub-display area is provided with a light-transmitting hole.

In an example embodiment of the present disclosure, the display panel further includes:

a touch electrode layer arranged on a side of the second inorganic layer away from the driving backplane, wherein the touch electrode layer is a mesh structure with a plurality of holes formed by a plurality of connected channel lines; and a light-shielding layer arranged on a side of the touch electrode layer away from the driving backplane, wherein an orthographic projection of the light-shielding layer on the driving backplane and orthographic projections of the channel lines on the driving backplane at least partially overlap, and the orthographic projection of the light-shielding layer on the driving backplane and orthographic projections of the holes on the driving backplane at most partially overlap.

According to an aspect of the present disclosure, there is provided a method for manufacturing a display panel, including:

forming a driving backplane;

forming a light-emitting layer, which includes a pixel definition layer and a plurality of light-emitting devices, on a side of the driving backplane, wherein the pixel definition layer has a plurality of openings, and one of the light-emitting devices is defined in one of the openings;

forming a first inorganic layer covering the light-emitting layer;

forming a lens layer, which includes a plurality of lenses, on a surface of the first inorganic layer away from the driving backplane, wherein one of the lenses and one of the light-emitting devices are arranged correspondingly;

forming an organic layer covering the lens layer and the first inorganic layer, wherein a refractive index of the organic layer is smaller than a refractive index of the first inorganic layer and smaller than a refractive index of the lenses; and forming a second inorganic layer covering the organic layer.

According to an aspect of the present disclosure, there is provided a display device, including the display panel according to any one of the above embodiments.

It is to be understood that both the foregoing general description and the following detailed description are exemplary and explanatory only and are not restrictive of the present disclosure.

BRIEF DESCRIPTION OF THE DRAWINGS

The accompanying drawings, which are incorporated in and constitute a part of the specification, illustrate embodiments consistent with the present disclosure and together with the specification serve to explain the principles of the present disclosure. Apparently, the drawings in the following description are only some embodiments of the present disclosure, and those skilled in the art may obtain other drawings according to these drawings without creative efforts.

DETAILED DESCRIPTION

Figure 1:
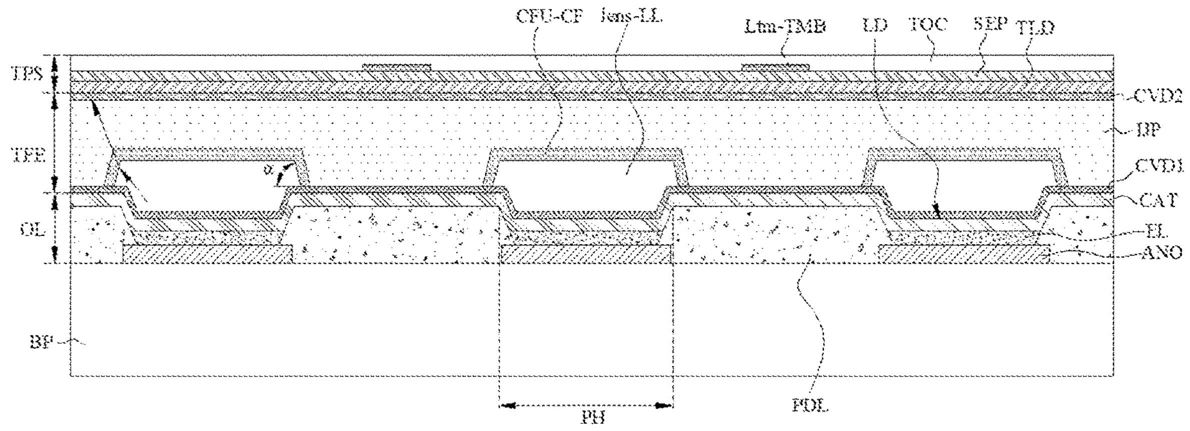
FIG. 1 is a schematic diagram of a display panel according to a first implementation of the present disclosure.

Example implementations will now be described more fully with reference to the accompanying drawings. Example implementations can, however, be embodied in many forms and should not be construed as limited to the implementations set forth herein; rather, these implementations are provided so that the present disclosure will be thorough and complete, and will fully convey the concept of example implementations to those skilled in the art. The same reference numerals in the drawings denote the same or similar structures, and thus their detailed descriptions will be omitted. Furthermore, the drawings are merely schematic illustrations of the present disclosure and are not necessarily drawn to scale.

The terms “a”, “an”, “the”, “said” and “at least one” are used to indicate the presence of one or more elements/components/etc.; the terms “comprising/comprises/comprise” and “having/has/have” are used to indicate an open-ended inclusive, and means that there may be additional elements/components/etc. in addition to the listed elements/components/etc. The words “first” and “second” are used as markers only, but are not used to limit the number of objects.

A row direction X and a column direction Y herein are only two directions perpendicular to each other. In the drawings of the present disclosure, the row direction X may be horizontal, and the column direction Y may be vertical, but the present disclosure is not limited thereto. If rotation of a display panel occurs, the actual orientation of the row direction X and the column direction Y may change. The X direction in the drawings exemplarily shows the row direction, and the Y direction exemplarily shows the column direction.

In related arts, a display panel may include a driving backplane and multiple light-emitting devices located on one side of the driving backplane. Each light-emitting device may be an organic light-emitting diode (OLED). Image display may be realized by controlling the light-emitting devices to emit light independently by the driving backplane. Also, the display panel further includes an encapsulation layer, which may cover the light-emitting devices and play a protective role of blocking external water and oxygen. The encapsulation layer may include a first inorganic layer, an organic layer and a second inorganic layer. The first inorganic layer covers the light-emitting devices, the organic layer is arranged on a surface of the first inorganic layer away from the driving backplane, and the second inorganic layer covers the organic layer. The light emitted by the light-emitting devices needs to pass through the first inorganic layer, the organic layer and the second inorganic layer when it is emitted.

After a lot of experiments and analysis, the inventor found that since the refractive index of the organic layer is lower than that of the first inorganic layer, part of the light emitted by the light-emitting devices will be totally reflected at the interface between the first inorganic layer and the organic layer, and thus it is difficult to improve the light extraction efficiency. To increase the brightness of the display panel, it is necessary to increase the power of the light-emitting devices, and this will result in an increase in the power consumption of the display panel. The inventor further found that since the distance between the interface and the light-emitting devices is only the thickness of the first inorganic layer, the distance is relatively short and the interface is roughly flat, when the light totally reflected by the interface is reflected by first electrode(s) of the light-emitting devices and reaches the interface again, the incident angle does not change significantly and the total reflection angle may still be reached, and thus the total reflection will occur again. This results in that the light which is totally reflected will experience back-and-forth reflections between the light-emitting devices and the interface between the first inorganic layer and the organic layer, and light never gets out, and thus it is difficult to improve the light extraction efficiency of the display panel.

Figure 2:
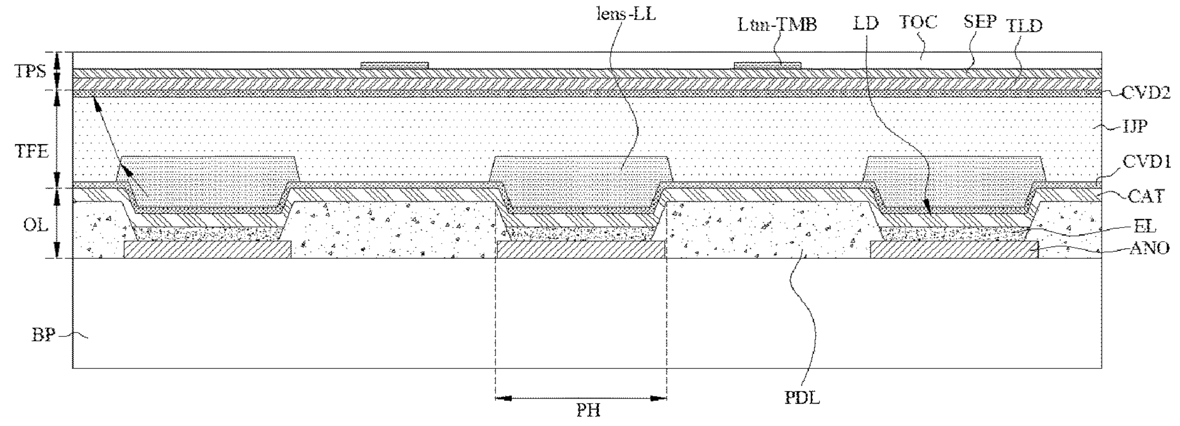
FIG. 2 is a schematic diagram of a display panel according to a second implementation of the present disclosure.
Figure 3:
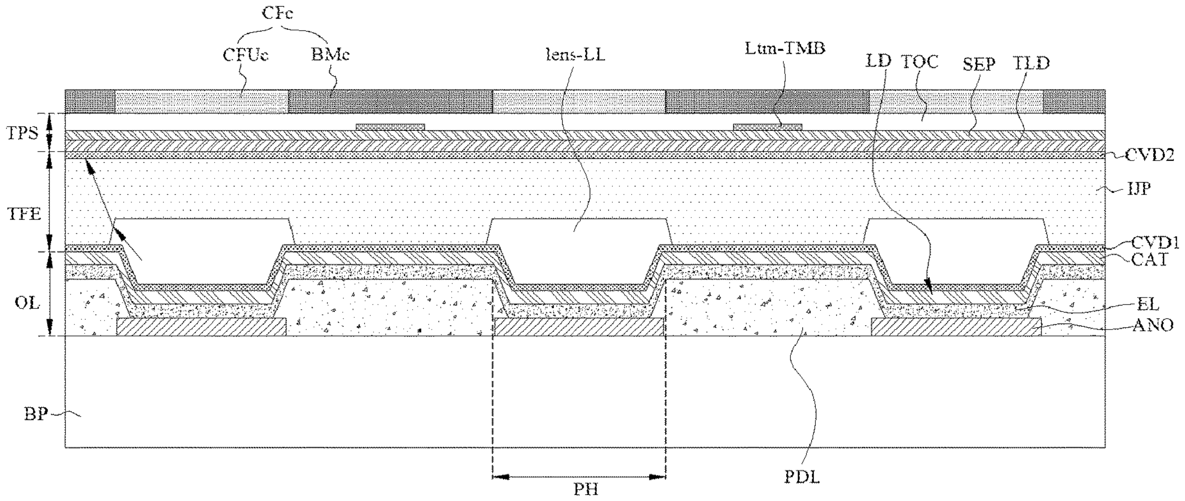
FIG. 3 is a schematic diagram of a display panel according to a third implementation of the present disclosure.

An implementation of the present disclosure provides a display panel. As shown in FIG. 1 to FIG. 3, the display panel may include a driving backplane BP, a light-emitting layer OL, a first inorganic layer CVD1, a lens layer LL, an organic layer IJP and a second inorganic layer CVD2.

The light-emitting layer OL is arranged on a side of the driving backplane BP and includes a pixel definition layer PDL and a plurality of light-emitting devices LD. The pixel definition layer PDL has a plurality of openings PH, and one of the light-emitting devices LD is defined in one of the openings PH. The first inorganic layer CVD1 covers the light-emitting layer OL. The lens layer LL is arranged on a surface of the first inorganic layer CVD1 away from the driving backplane BP, and includes a plurality of lenses. One of the lenses and one of the light-emitting devices LD are arranged correspondingly. The organic layer IJP covers the lens layer LL and the first inorganic layer CVD1. A refractive index of the organic layer IJP is smaller than a refractive index of the first inorganic layer CVD1 and smaller than a refractive index of the lenses. The second inorganic layer CVD2 covers the organic layer IJP.

The display panel in the implementation of the present disclosure has at least the following effects:

As shown in FIG. 1 to FIG. 3, if the refractive index of the lenses is greater than or equal to the refractive index of the first inorganic layer CVD1, the light emitted by the light-emitting devices LD will not be totally reflected at the interface where the first inorganic layer CVD1 contacts the lenses, and thus the light may enter the lenses through the first inorganic layer CVD1. Even if total reflection occurs on the surface of a lens, because each lens is a three-dimensional structure, its surface is no longer a simple plane (the interface where the first inorganic layer CVD1 contacts the organic layer IJP), the total reflection angles of different areas may be different, and at least part of light which experiences back-and-forth reflections between the surface of the lens and a light-emitting device LD and cannot get out may be reduced. Thus, the light extraction efficiency may be increased, and it is beneficial to reduce power consumption while ensuring the brightness.

If the refractive index of the lenses is smaller than the refractive index of the first inorganic layer CVD1, since the refractive index of the organic layer IJP is smaller than the refractive index of the lenses, the difference between the refractive index of the first inorganic layer CVD1 and the refractive index of the lenses may be smaller than the difference between the refractive index of the lenses and the refractive index of the first inorganic layer CVD1, even if total reflection occurs at the interface between the lenses and the first inorganic layer CVD1, the influence of the total reflection may also be reduced as compared with a case where the organic layer IJP is directly in contact with the first inorganic layer CVD1, thereby improving the light extraction efficiency.

In addition, the first inorganic layer CVD1, the organic layer IJP and the second inorganic layer CVD2 may form a thin-film encapsulation structure to prevent external water and oxygen from corroding the light-emitting devices LD. In the present disclosure, the lens layer LL is integrated inside the thin film encapsulation structure, which can prevent the display panel from being too thick while improving the light extraction efficiency.

The following is a detailed description of the display panel in the present disclosure.

The following provides an exemplary description of the basic structure of the display panel of the present disclosure.

As shown in FIGS. 1 to 3, the driving backplane BP has a driving circuit, which may drive the light-emitting devices LD to emit light to display images.

The driving backplane BP may include a substrate and a circuit layer on a side of the substrate. The substrate may be a flat plate structure, and its material may be a hard material such as glass, or a soft material such as polyimide.

Figure 12:
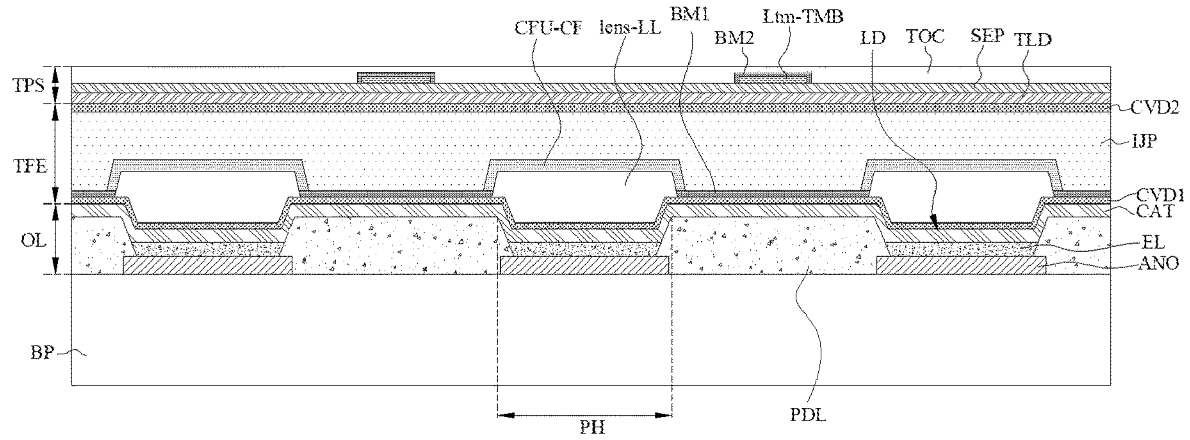
FIG. 12 is a schematic diagram of a display panel according to an eighth implementation of the present disclosure.

The circuit layer may be arranged on a side of the substrate, and the circuit layer may include a driving circuit, which may drive the light-emitting devices LD to emit light. For example, as shown in FIG. 12, the display panel may be at least divided into a display area AA and a peripheral area SA located outside the display area AA. Correspondingly, an area of the circuit layer located in the display area AA is a pixel area, and an area located in the peripheral area SA is an edge area, that is, the edge area is located outside the pixel area. The driving circuit may include at least one pixel circuit located in the pixel area and at least one peripheral circuit located in the edge area. The pixel circuit may be a pixel circuit such as 3T1C, 6T1C, 7T1C, or 7T2C, as long as it may drive a light-emitting device LD to emit light, and its structure is not particularly limited here. The number of at least one pixel circuit may be the same as the number of light-emitting devices LD, and they are connected to light-emitting devices LD in a one-to-one correspondence, so as to respectively control a corresponding light-emitting device LD to emit light. The nTmC indicates that a pixel circuit includes n transistors (indicated by the letter "T") and m capacitors (indicated by the letter "C"). Certainly, the same pixel circuit may also be connected with multiple light-emitting devices LD, and simultaneously drive the multiple light-emitting devices LD to emit light, which is not specifically limited here.

The at least one peripheral circuit is connected with the pixel circuit(s), and is used for inputting a driving signal to the pixel circuit(s) so as to control the light-emitting devices LD to emit light. The at least one peripheral circuit may include a gate driving circuit and a light-emitting control circuit. Of course, the at least one peripheral circuit may also include other circuits, and the specific structure of the at least one peripheral circuit is not specifically limited here.

The above-mentioned circuit layer may include a plurality of thin film transistors and capacitors. The thin film transistors may be top-gate or bottom-gate thin film transistors. Each thin film transistor may include an active layer and a gate. Taking a top-gate thin film transistor as an example, the circuit layer may include a semiconductor layer, a first gate insulating layer, a first gate layer, a second gate insulating layer, a second gate layer, an interlayer dielectric layer, a first source and drain layer, a passivation layer, a first planarization layer, a second source and drain layer and a second planarization layer which are sequentially stacked in a direction away from the substrate. The specific patterns of the film layers may be determined depending on specific composition of the driving circuits, which is not specifically limited here.

As shown in FIGS. 1 to 3, the light-emitting layer OL is arranged on a side of the driving backplane BP, and includes light-emitting devices LD and a pixel definition layer PDL for limiting the range of each light-emitting device LD. For example, the pixel definition layer PDL and the light-emitting devices LD may be arranged on a surface of the second planarization layer away from the substrate. The orthographic projection of each light-emitting device LD on the circuit layer may be located in the pixel area, that is, in the display area AA of the display panel. Each light-emitting device LD may include a first electrode ANO, a second electrode CAT, and a light-emitting material layer EL between the first electrode ANO and the second electrode CAT. By applying electric signal(s) to the first electrode ANO and the second electrode CAT, the light-emitting material layer EL may be excited to emit light. The light-emitting device LD may be an organic light-emitting diode (OLED).

As shown in FIGS. 1 to 3, the first electrodes ANOs of light-emitting devices LD are distributed as being spaced from each other, and the pixel definition layer PDL is provided with openings PH exposing each of first electrodes ANO. That is, one opening PH exposes one first electrode ANO. The pixel definition layer PDL may be used to define the range of each light-emitting device LD, the range of an opening PH is the range of a light-emitting device LD, and the boundary of the orthographic projection of the light-emitting device LD on the driving backplane BP is the boundary of the opening PH on the driving backplane BP. If the side wall of the opening PH is a slope expanding in a direction away from the driving backplane BP, the orthographic projection of the light-emitting device LD on the driving backplane BP is the outer boundary of the orthographic projection of the opening PH on the driving backplane BP. The shape of the opening PH, that is, the shape of the boundary of its orthographic projection on the driving backplane BP, may be a polygon such as a rectangle, a pentagon, or a hexagon, or an ellipse, a sector, or other shapes. The shape of the opening PH is not specially limited.

The light-emitting material layer EL is at least partly located in the opening PH and stacked with the first electrode ANO. The light-emitting material layer EL may include a hole injection layer, a hole transport layer, a light-emitting material layer EL, an electron transport layer, and an electron injection layer sequentially stacked in a direction away from the driving backplane BP. Of course, other structures may also be used, as long as they may cooperate with the first electrode ANO and the second electrode CAT to emit light.

The second electrode CAT may cover the light-emitting material layer EL, and the second electrode CAT may be a continuous whole layer structure, so that light-emitting devices LD may share the same second electrode CAT. The second electrode CAT may be recessed into openings PH at positions corresponding to the openings PH. Also, the second electrode CAT may be the cathodes of the light-emitting devices LD, which may adopt a light-transmitting structure, so that the light-emitting devices LD may emit light in a direction away from the driving backplane BP. For example, the material of the second electrode CAT may be metal magnesium, silver or its alloys, etc., and under a certain thickness, the second electrode may transmit light while conducting electricity. Meanwhile, the first electrode(s)

ANO may be in an opaque structure, so that the light-emitting devices LD have a top emission structure.

The second electrode CAT may extend to the edge area of the circuit layer, and is connected with a common power signal line, and may receive a common power signal. The common power signal line may be arranged in the same layer as the first electrodes ANO, and thus the second electrode CAT may be in the edge area and connected to the common power signal line. When displaying images, a pixel power signal may be applied to a first electrode ANO through the control of a pixel circuit, and the pixel circuit may receive the pixel power signal through a pixel power line located in the second source and drain layer, and apply the common power signal to the second electrode DAT through the common power signal line to excite the light-emitting layer OL to emit light. The specific principle of organic electroluminescence will not be described in detail here.

In some implementations of the present disclosure, as shown in FIGS. 1 to 3, each light-emitting device LD may emit light independently, and the color of light emitted by different light-emitting devices LD may be different. Specifically, the light-emitting material layer EL may include multiple light-emitting units arranged as being spaced in respective openings PH in a one-to-one correspondence. Each light-emitting unit may emit light independently, and the color of light emitted by each light-emitting unit may be different, so that color display may be directly realized. Correspondingly, the second electrode CAT covers the light-emitting material layer EL, and also covers an area of the pixel definition layer PDL not covered by the light-emitting material layer EL.

Figure 19:
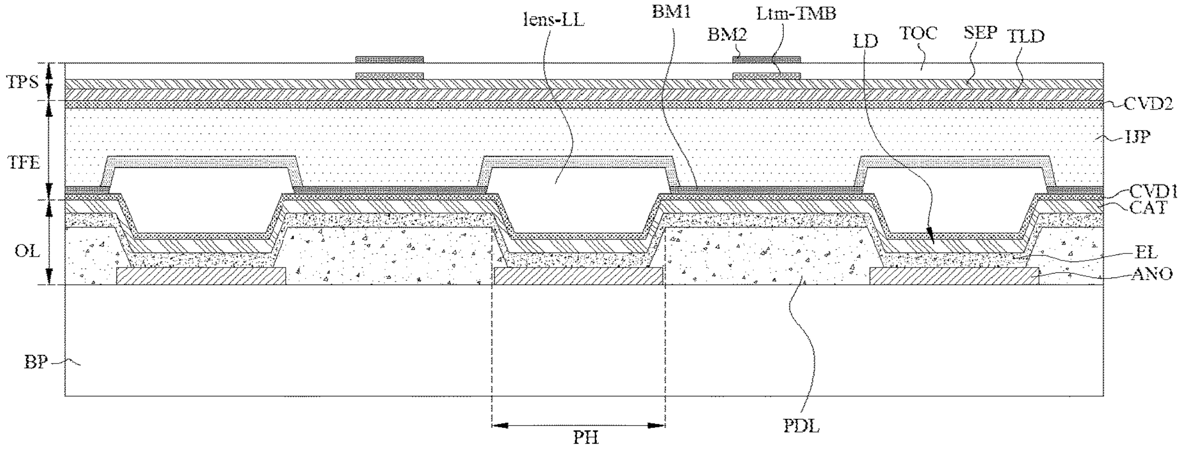
FIG. 19 is a schematic diagram of a display panel according to a fourteenth implementation of the present disclosure.
Figure 20:
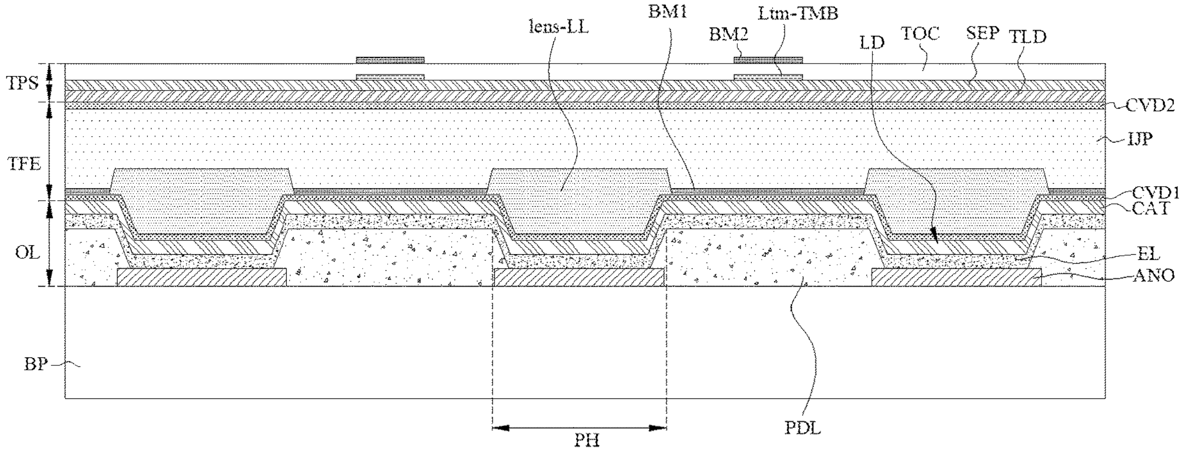
FIG. 20 is a schematic diagram of a display panel according to a fifteenth implementation of the present disclosure.

In some implementations of the present disclosure, as shown in FIG. 19 and FIG. 20, the light-emitting material layer EL may also cover the pixel definition layer PDL and each first electrode ANO at the same time, that is, light-emitting devices LD may share the same light-emitting material layer EL. Also, light-emitting devices LD emit the same color. In order to realize color display, a filter structure that only transmits monochromatic light may be provided on a side of the light-emitting devices LD away from the driving backplane BP.

As shown in FIGS. 1 to 3, the display panel may also include an encapsulation layer TFE, which may cover respective light-emitting devices LD, and is used to protect the light-emitting layer OL, and prevent external water and oxygen from corroding the light-emitting devices LD. For example, the encapsulation layer TFE may adopt a method of thin film encapsulation, which may include the first inorganic layer CVD1, the organic layer IJP and the second inorganic layer CVD2.

The first inorganic layer CVD1 may cover respective light-emitting devices LD, that is, the first inorganic layer CVD1 may cover a surface of the second electrode CAT away from the driving backplane BP. The material of the first inorganic layer CVD1 may include an inorganic insulating material such as silicon nitride or silicon oxide. Also, since the second electrode CAT is recessed at the positions corresponding to the openings PH, correspondingly, the first inorganic layer CVD1 is also recessed at the positions corresponding to the openings PH, forming recesses SP.

The organic layer IJP may be arranged on a surface of the first inorganic layer CVD1 away from the driving backplane BP, and the boundary of the organic layer IJP may be defined as being in an inner side of the boundary of the first inorganic layer CVD1 by a blocking dam in the peripheral area SA, and the boundary of the orthographic projection of the organic layer IJP on the driving backplane BP may be located in the peripheral area SA, ensuring that the organic layer IJP can cover each light-emitting device LD. The material of the organic layer IJP may be an organic material such as resin, whose refractive index is smaller than the refractive index of the first inorganic layer CVD1, and smaller than the refractive index of the second inorganic layer CVD2, and the difference between the two may be 0.5. For example, the refractive index of the first inorganic layer CVD 1 may be 1.6-1.8, the refractive index of the organic layer IJP may be 1.1-1.3; of course, other values may also be used.

The second inorganic layer CVD2 may cover the organic layer IJP and the first inorganic layer CVD1 that is not covered by the organic layer IJP. The second inorganic layer CVD2 may block the intrusion of water and oxygen, and planarization may be realized through the flexible organic layer IJP. The material of the second inorganic layer CVD2 may include an inorganic insulating material such as silicon nitride, or silicon oxide. It should be noted that the color filter layer mentioned in some implementations above may be arranged on a side of the encapsulation layer TFE away from the driving backplane BP.

Figure 4:
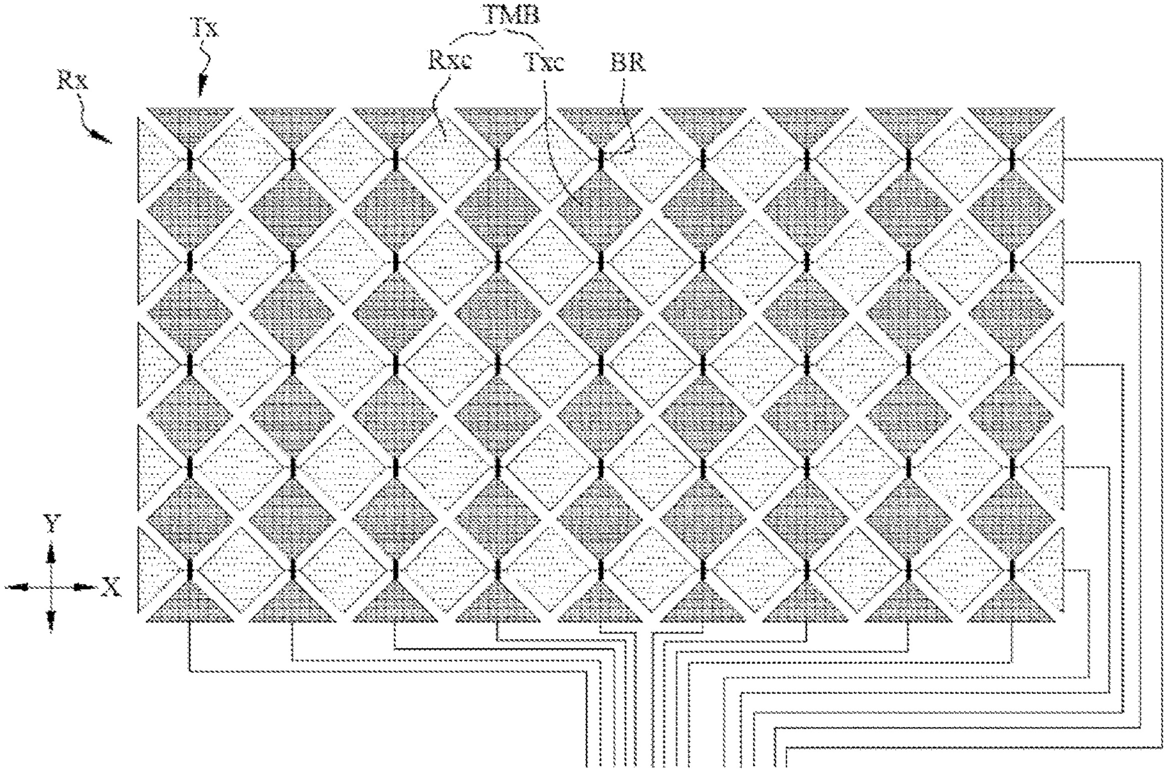
FIG. 4 is a schematic top view of a touch layer in a display panel according to an implementation of the present disclosure.
Figure 5:
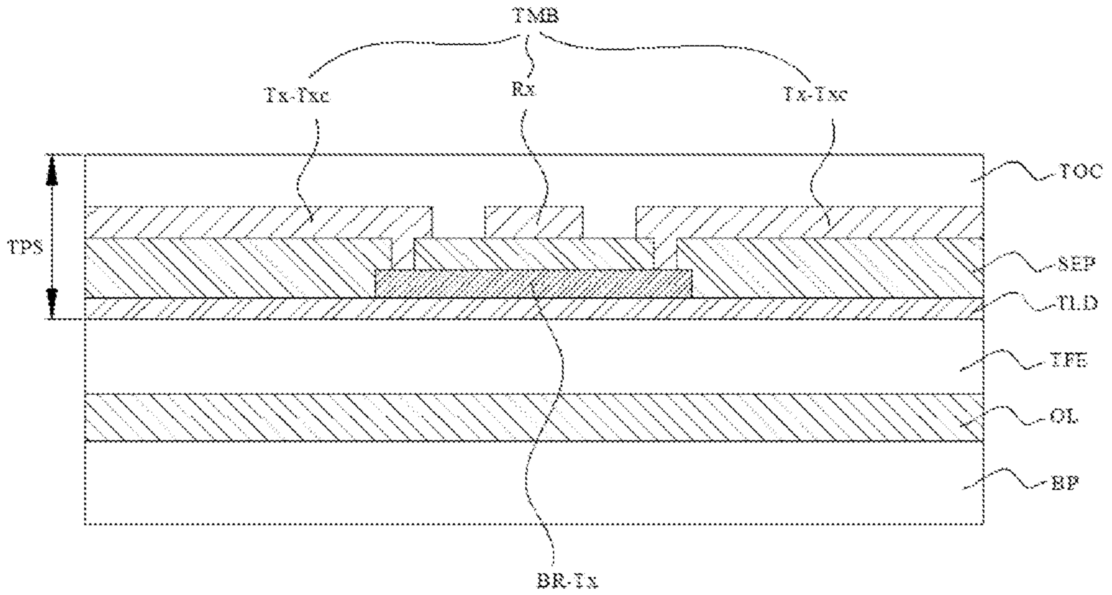
FIG. 5 is a schematic partial cross-sectional view of a display panel according to an implementation of the present disclosure.

In some implementations of the present disclosure, as shown in FIGS. 1 to 3, the display panel may further include a touch layer TPS, which may be arranged on a side of the encapsulation layer TFE away from the driving backplane BP, and used for sensing a touch operation. Taking the touch layer TPS adopting a mutual capacitive touch structure as an example, as shown in FIG. 4 and FIG. 5, the touch layer TPS may include a plurality of first touch electrodes Tx and a plurality of second touch electrodes Rx. The first touch electrodes Tx may be distributed as being spaced from each other along the row direction X. One of the first touch electrodes Tx may include a plurality of first electrode blocks Txc distributed as being spaced from each other along the column direction Y and interconnect bridges BR each of which is used for connecting two adjacent first electrode blocks Txc. The second touch electrodes Rx may be distributed as being spaced from each other along the column direction Y. One of the second touch electrodes Rx includes a plurality of second electrode blocks Rxc connected in series along the row direction X. One of the interconnect bridges BR and a second touch electrode Rx cross and are insulated. One of a first touch electrodes Tx and a second touch electrodes Rx may be used as a transmitting electrode, and the other may be used as a receiving electrode, both of which are connected to a peripheral touch driving circuit.

The above-mentioned first electrode blocks Txc and second touch electrodes Rx are located in the touch electrode layer TMB, that is, the first electrode blocks Txc and the second touch electrodes Rx are arranged in the same layer, and thus they may be formed simultaneously through the same process. The interconnect bridges BR may be located in an interconnect layer, which may be located between the touch electrode layer TMB and the encapsulation layer TFE. In addition, the touch layer TPS may also include a buffer layer TLD and an isolation layer SEP.

The buffer layer TLD may be arranged on a surface of the encapsulation layer TFE away from the driving backplane BP, and its material may be silicon nitride, silicon oxide or other insulating materials, which are not specifically limited here. The interconnect layer may be arranged on a surface of the buffer layer TLD away from the driving backplane BP, and includes a plurality of interconnect bridges BR. The interconnect layer may be made of metal or other conductive materials. The isolation layer SEP may cover the interconnect layer, and the material of the isolation layer SEP may be an insulating material such as silicon nitride, or silicon oxide, which are not specifically limited here. The touch electrode layer TMB may be arranged on the surface of the isolation layer SEP away from the driving backplane BP, and includes the first electrode blocks Txc and the second touch electrodes Rx mentioned above.

Of course, the touch layer TPS may also use a self-capacitive touch structure. For example, the touch layer TPS may include a touch electrode layer TMB, and the touch electrode layer TMB may include a plurality of electrode blocks distributed in an array, and each electrode block may be connected to a peripheral touch driving circuit through an independent trace. The specific structure of the self-capacitive touch structure is not limited here, as long as the touch control function may be realized.

As shown in FIG. 1 to FIG. 3 and FIG. 6, in order to improve the light transmittance and reduce the shielding on the light-emitting devices LD by the touch electrode layer TMB, the touch electrode layer TMB may be a mesh structure formed by a plurality of connected channel lines Ltm, and the mesh structure has a plurality of holes TH. In some implementations of the present disclosure, one light-emitting device LD may correspond to one hole TH, that is, the orthographic projection of one light-emitting device LD on the driving backplane BP is located within the orthographic projection of the one hole TH on the driving backplane BP. One hole TH may correspond to only one light-emitting device LD, and the shape of the hole TH may be the same as that of the light-emitting device LD. Certainly, in other implementations of the present disclosure, one hole TH may correspond to a plurality of light-emitting devices LD.

In some implementations of the present disclosure, as shown in FIGS. 1 to 3, the touch layer TPS may further include a protective layer TOC, which may cover the touch electrode layer TMB. The touch electrode layer TMB may be protected by the protective layer TOC, and planarization may be realized, so as to form a film layer on top of the touch layer TPS.

In some implementations of the present disclosure, the display panel may further include a cover plate, which may be made of a transparent material such as glass or acrylic, and may be provided on a side of the touch layer TPS away from the driving backplane BP. For example, the cover plate may be provided on a side of the protective layer TOC away from the driving backplane BP. The film layer covered by the cover plate may be protected by the cover plate.

The following describes the lens layer LL in detail based on the above display panel architecture.

As shown in FIG. 1, the lens layer LL may be arranged in the encapsulation layer TFE to avoid increasing the thickness of the display panel. Specifically, the lens layer LL may be arranged on a surface of the first inorganic layer CVD1 away from the driving backplane BP, and covered by the organic layer IJP, so that the lens layer LL is placed in the encapsulation layer TFE.

The lens layer LL may include a plurality of lenses distributed in an array. In the direction perpendicular to the driving backplane BP, at least a part of the light-emitting devices LD may be arranged corresponding to the lenses, and one lens may be arranged corresponding to one light-emitting device LD, that is, one lens is arranged as corresponding to an opening PH. The corresponding arrangement of a lens and a light-emitting device LD means that the orthographic projections of the lens and the light-emitting device LD on the driving backplane BP at least partially overlap. Of course, the number of lenses may be the same as the number of light-emitting devices LD, and each lens may be set corresponding to a light-emitting device LD, so that at least part of the light emitted by each light-emitting device LD may pass through its corresponding lens.

As shown in FIG. 1 to FIG. 3, in order to allow the light emitted by a light-emitting device LD to enter a lens without total reflection at the interface where the lens contacts the first inorganic layer CVD1, the refractive index of the lens may be not less than the refractive index of the first inorganic layer CVD1. For example, the refractive index of the lens is equal to the refractive index of the first inorganic layer CVD1. Since the lens is bonded to the first inorganic layer CVD1, when the light propagates from the first inorganic layer CVD1 to the lens, the light path does not change. Of course, the refractive index of the lens may also be greater than that of the first inorganic layer CVD1, as long as total reflection can be avoided. In this procedure, due to the existence of the lens, the condition of total reflection at the interface where the first inorganic layer CVD1 contacts the organic layer IJP in the related art is destroyed, preventing total reflection from occurring at the interface, thereby achieving light extraction. Also, because the lens is a three-dimensional structure, its surface is no longer a pure plane (the interface where the first inorganic layer CVD1 contacts the organic layer IJP), the total reflection angles of different areas may be different, the light which experiences back-and-forth reflections between the surface of the lens and the light-emitting device LD and cannot get out is reduced, thereby improving the light extraction efficiency.

Of course, in other implementations of the present disclosure, the refractive index of the lens may be smaller than the refractive index of the first inorganic layer CVD1, but the refractive index of the lens is greater than the refractive index of the organic layer IJP, so that the difference between the refractive index of the first inorganic layer CVD1 and the refractive index of the lens is smaller than the difference between the refractive index of the first inorganic layer CVD1 and the refractive index of the organic layer IJP. For example, the difference between the refractive index of the first inorganic layer CVD1 and the refractive index of the lens is less than 0.5, and the difference between the refractive index of the first inorganic layer CVD1 and the organic layer IJP may be 0.5. As compared with a situation where the organic layer IJP directly contacts the first inorganic layer CVD1 of a corresponding light-emitting device LD, the present disclosure can reduce the light totally reflected at the surface of the first inorganic layer CVD1 away from the driving backplane BP, thereby improving the light extraction efficiency.

Figure 6:
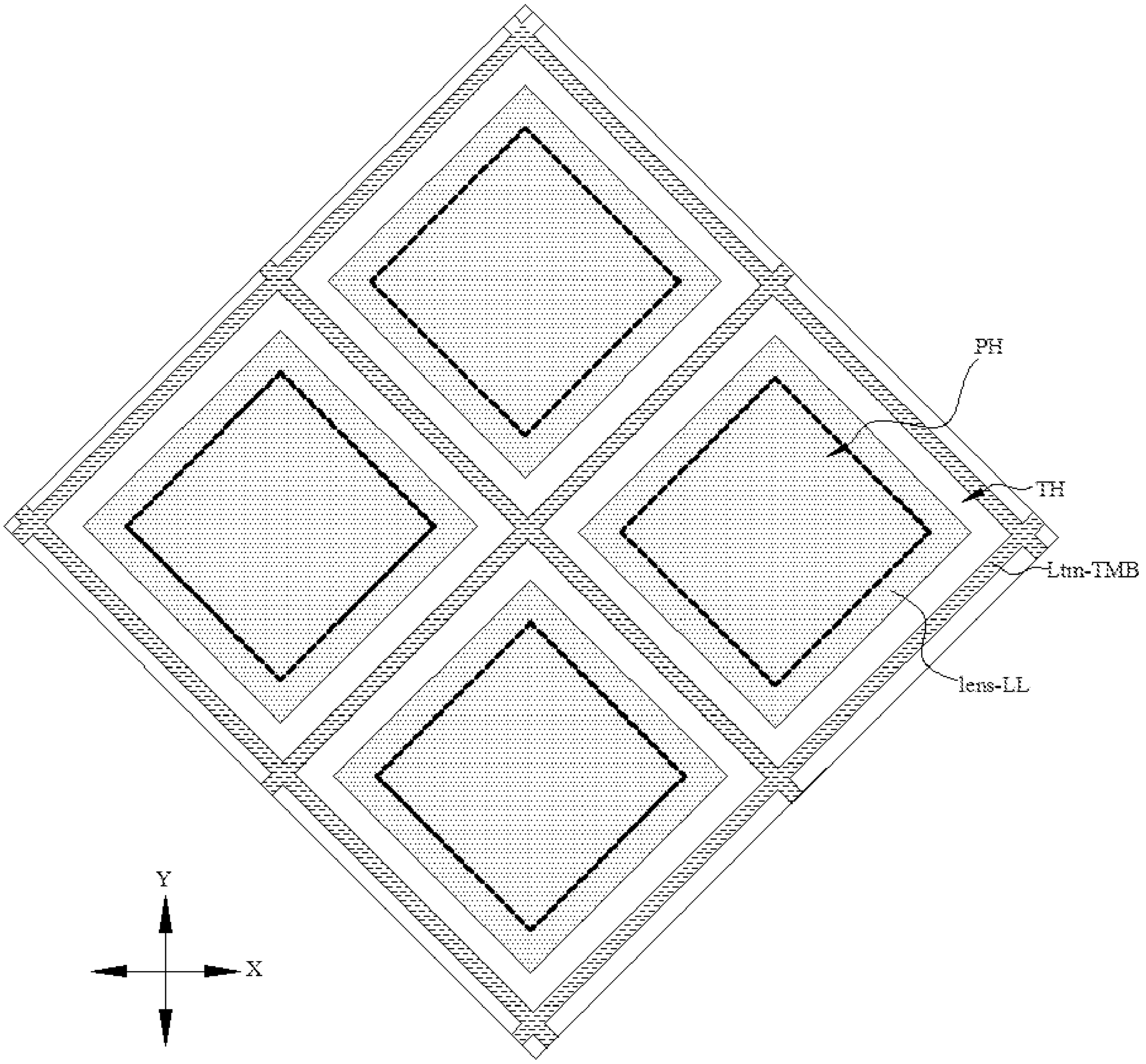
FIG. 6 is a partial top view of a display panel according to an implementation of the present disclosure.

In some implementations of the present disclosure, as shown in FIGS. 1 to 3, in a lens and an opening PH where its corresponding light-emitting device LD is located: the boundary of the lens may surround outside of the opening PH. That is, the range covered by the lens is not smaller than the range of the light-emitting device LD, so that all the light emitted by the light-emitting device LD can enter the lens, without being totally reflected caused by not being covered by the lens. Also, as shown in FIG. 6, the shape of the boundary of the orthographic projection of the lens on the driving backplane BP may be the same as the shape of the boundary of the orthographic projection of the opening PH on the driving backplane BP. For example, the shape of the opening PH is polygon such as rectangle, rhombus, pentagon or hexagon, and the boundary of the orthographic projection of the lens on the driving backplane BP is also the same polygon; if the shape of the opening PH is elliptical, the boundary of the orthographic projection of the lens on the driving backplane BP is also elliptical. In some implementations of the present disclosure, as shown in FIG. 6, if the shape of the boundary of the orthographic projection of the opening PH on the driving backplane BP is a polygon, the shape of the boundary of the orthographic projection of the lens on the driving backplane BP is the same polygon, and the sides of the polygon of the orthographic projection of the lens are parallel to or coincide with the sides of the polygon of the orthographic projection of the opening PH in a one-to-one correspondence.

Figure 7:
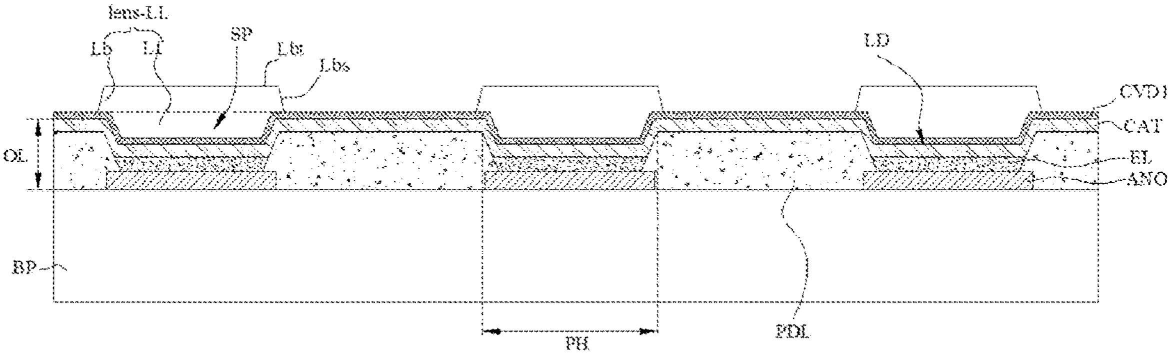
FIG. 7 is a partial cross-sectional view of a lens layer, a light-emitting layer and a driving backplane of a display panel according to an implementation of the present disclosure.

In some implementations of the present disclosure, as shown in FIG. 7, with respect to a recess SP of the first inorganic layer CVD1, a lens may include a filling portion Lf and a protrusion portion Lb. The filling portion Lf may fill the recess SP, and its shape is the same as that of the recess SP. The protrusion portion Lb is stacked on a side of the filling portion Lf away from the driving backplane BP, and protrudes from the recess SP, that is, the protrusion portion Lb is located above the surface of the first inorganic layer CVD1 away from the driving backplane BP, and the filling portion Lf is located below the surface.

In some implementations of the present disclosure, as shown in FIG. 7, the protrusion portion Lb has a top surface Lbt and an outer peripheral surface Lbs surrounding the top surface Lbt, and the outer peripheral surface Lbs is connected between the top surface Lbt and the filling portion Lf. The top surface Lbt is the surface of the lens away from the driving backplane BP, and the top surface Lbt may be a plane parallel to the driving backplane BP, or may be an arc or other curved surface. The outer peripheral surface Lbs extends around the edge of the top surface Lbt. In a lens and the recess SP it fills: the orthographic projection of the opening PH corresponding to the recess SP on the driving backplane BP is located within the orthographic projection of the top surface Lbt on the driving backplane BP, that is, the top surface Lbt is not smaller than the opening PH.

The present disclosure may also achieve color display or reduce the reflection of ambient light for different implementations through light filtering. The following is an exemplary description.

In some implementations of the present disclosure, as shown in FIG. 1, a lens is a transparent structure that may transmit white light. A filter layer CF is formed in the encapsulation layer TFE. The filter layer may include a plurality of filter units CFU that only allow monochromatic light to pass through. The number of filter units CFU may be less than or equal to the number of lenses and distributed in an array. Each filter unit CFU may cover a lens, and the organic layer IJP covers each filter unit CFU. Also, the color of the monochromatic light allowed to pass though by different filter units CFU may be different. For example, the filter units CFU include a filter unit CFU that may all red light to pass through, a filter unit CFU that may allow green light to pass through, and a filter unit CFU that may allow blue light to pass through. The material of the filter layer CF may be an organic material such as resin, as long as the material can achieve light filtering. Color display may be realized or the effect of reducing the reflection of ambient light may be realized through the filter function of the filter units CFUs.

In some implementations of the present disclosure, as shown in FIG. 1, the light-emitting material layer EL may include a plurality of spaced light-emitting units arranged in openings PH in a one-to-one correspondence. Each light-emitting unit may emit light independently, and the color of emitted light may be different. Correspondingly, the color of light emitted by different light-emitting devices LD may be different. In this implementation, at least three kinds of light-emitting devices LD with different color of emitted light are included, for example, light-emitting devices LD that emit red light, light-emitting devices LD that emit green light, and light-emitting devices LD that emit blue light. The color of the monochromatic light that a filter unit CFU allows to pass through is the same as the color of light emitted by the light-emitting device LD corresponding to the covered lens, so that the light emitted by the light-emitting device LD may pass through the corresponding filter unit CFU, and the color of the light emitted by the light-emitting device LD is the same as the color of the corresponding filter unit CFU. Since the light-emitting device LD itself may emit monochromatic light, the realization of color display does not necessarily depend on the filtering effect of the filter unit CFU; however, through the filtering effect of the filter unit CFU, the ambient light entering the display panel may be reduced, and the outgoing of ambient light reflected by a reflective film layer such as the first electrode ANO may be reduced, so as to reduce the reflection of the ambient light, thereby avoiding the use of a circular polarizer. This is beneficial to thinning the display panel.

In some implementations of the present disclosure, as shown in FIG. 19, the light-emitting material layer EL may also cover the pixel definition layer PDL and each first electrode ANO at the same time, that is, the light-emitting devices LD may share the same light-emitting material layer EL. In this case, the color of light emitted by the light-emitting devices LD emits is the same, and the filtering effect of the filter unit CFU may be used to realize color display. That is, the filter unit CFU may be used as the above-mentioned filter structure to realize color display. Of course, in this implementation, the filter unit CFU may also reduce the reflection of ambient light.

In addition, in other implementations of the present disclosure, as shown in FIG. 2 and FIG. 20, a lens may also be directly made of a material that may filter light, so that the lens may play the role of the above-mentioned filter unit CFU, and thus it is not necessary to arrange the filter layer CF. The color of the monochromatic light that may pass through different lenses may be different. For example, the lenses may include a lens that allows red light to pass through, a lens that allows green light to pass through, and a lens that allows blue light to pass through. For the case where the light-emitting material layer EL includes a plurality of light-emitting units distributed as being spaced from each other, the lenses may reduce the reflection of ambient light. For the case where light-emitting devices LD may share the same light-emitting material layer EL, the lens itself may be used as the light filtering structure mentioned above, and of course, the lens may also reduce the reflection of ambient light.

In some implementations of the present disclosure, both a scheme where a lens is formed with a filter material and a scheme where a lens allowing white light to pass through is combined with a filter unit CFU may be used at the same time. That is, a part of the lenses uses a filter material, and thus such lenses do not need to be covered with filter units CFU, and the other part of the lenses may be made of a material that allows white light to pass through, and filter units CFU may cover on such lenses.

In some implementations of the present disclosure, as shown in FIG. 3, a lens allowing white light to pass through may be used together with a color filter layer CFc. The color filter layer includes filter portions CFUc and light-absorbing portions BMc that separates the filter portions CFUc. The filter portions CFUc are set in one-to-one correspondence with the light-emitting devices LD. The light-emitting material layer EL may include a plurality of light-emitting units, and the color of a filter portion CFUc is the same as that of a corresponding light-emitting device. The light-emitting material layer EL may also have a whole layer structure.

Figure 18:
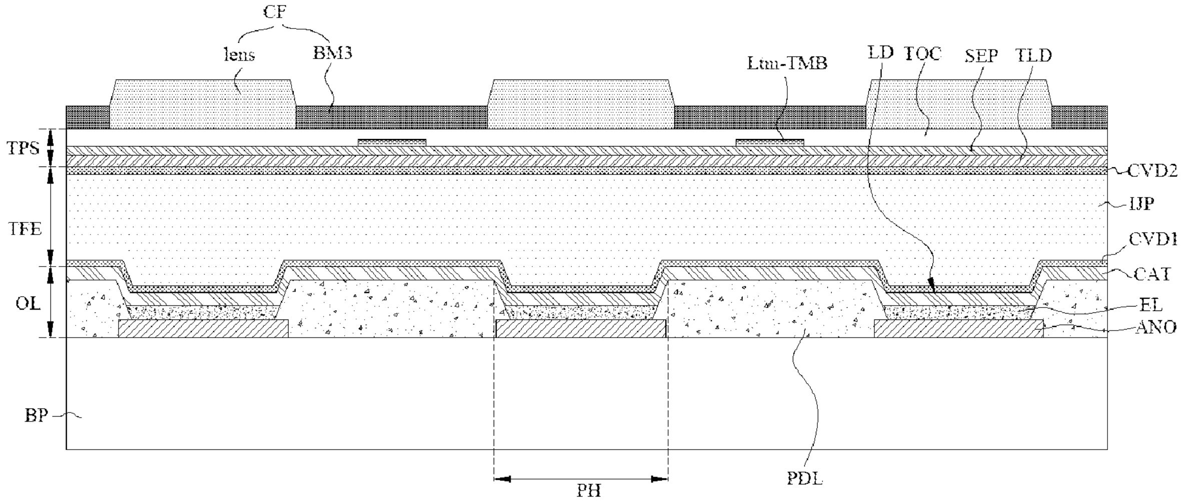
FIG. 18 is a schematic diagram of a display panel according to a thirteenth implementation of the present disclosure.

In addition, as shown in FIG. 18, the filter layer CF formed by the lenses of the filter material may also be used to form a color filter layer, and the color filter layer is arranged on the side of the encapsulation layer TFE away from the driving backplane BP, and the color filter layer may also include divider portions BM 3 that separate light-absorbing material of respective lenses, and its effect is similar to the above solution of being integrated in the encapsulation layer TFE, and may also be used to realize color display and reduce reflection of ambient light.

In some implementations of the present disclosure, as shown in FIG. 7, the refractive index of the filter layer CF may be smaller than the refractive index of the lens, and the difference between the two may be 0.5. For example, the refractive index of the lens may be 1.6-1.8, and the refractive index of the filter layer CF may be 1.1-1.3. Of course, other values may also be used. For a lens with the protrusion portion Lb and the filling portion Lf, the outer peripheral surface Lbs may shrink along the direction away from the driving backplane BP. That is, the protrusion portion Lb gradually narrows along the direction away from the driving backplane BP. For example, the protrusion portion Lb may be a truncated prism, a truncated cone, etc. that shrink in a direction away from the driving backplane BP. Also, the orthographic projection of the outer peripheral surface Lbs on the driving backplane BP may surround outside of the orthographic projection of the opening PH corresponding to the recess SP on the driving backplane BP, that is, the outer peripheral surface surrounds outside of the opening PH.

As shown in FIG. 1 to FIG. 3, since the refractive index of the filter layer CF is smaller than the refractive index of the lens, at least part of the light irradiated to the outer peripheral surface Lbs of the protrusion portion Lb is refracted at the interface where the filter unit CFU contacts the outer peripheral surface Lbs. Since the refraction angle is greater than the incident angle, the effect of converging light is produced, which is beneficial to improving the brightness of the front of the display panel. Also, the converging of the light may reduce its incident angle on the cover plate, making it difficult for total reflection to occur at the interface between the cover plate and the outside world, which is also conducive to improving the light extraction efficiency. Furthermore, the refractive index of the filter layer CF may be made not less than the refractive index of the organic layer IJP, for example, the refractive index of the filter layer CF is equal to the refractive index of the organic layer IJP, so that when light enters the organic layer IJP from the filter layer CF, the light path will not change.

Further, the outer peripheral surface Lbs may be formed by a plurality of surrounding planes, and each plane is an inclined slope, and the slope angle $\alpha$ of each plane is not greater than 90°. The slope angle $\alpha$ of a slope refers to an angle between the slope and an area of the surface of the first inorganic layer CVD1 away from the driving backplane BP other than the recess SP, that is, the angle between the slope and the substrate. The closer the slope angle $\alpha$ is to 90°, the closer the slope is to being perpendicular to the driving backplane BP. In order to increase the effect of converging light, the slope angle $\alpha$ may be made greater than 45°, and as the slope angle $\alpha$ increases, it is beneficial to enhance the converging effect.

In addition, in other implementations of the present disclosure, the surface of the protrusion portion Lb of the above lens may also be a curved surface, such as a hemispherical surface or a paraboloid, as long as at least part of the light rays may be converged.

It should be noted that the converging effect of the lens on the light of the light-emitting device LD mentioned herein means that the light after passing through the lens is closer to the optical axis (a central axis perpendicular to the driving backplane BP and passing through the geometric center of the lens) of the lens than the light before passing through the lens, that is, converging toward the optical axis, but not necessarily intersecting with the optical axis, as long as the light is deflected toward the optical axis compared with the incident light of the lens.

In order to further enhance the effect of reducing the reflection of ambient light, a light-absorbing structure may be used to shield the area outside the lenses to prevent ambient light from entering. The light-absorbing structure solution may be a light-absorbing layer BM1 specially provided with a light-absorbing material, or the pixel definition layer PDL may be set as a light-absorbing material. The light-absorbing material may be black resin or other material. The light-absorbing structure may be arranged on the same side of the driving backplane BP as the light-emitting layer OL. The orthographic projection of the light-absorbing structure on the driving backplane BP separates the orthographic projections of lenses on the driving backplane BP, so that ambient light may be absorbed by the light-absorbing structure.

Figure 8:
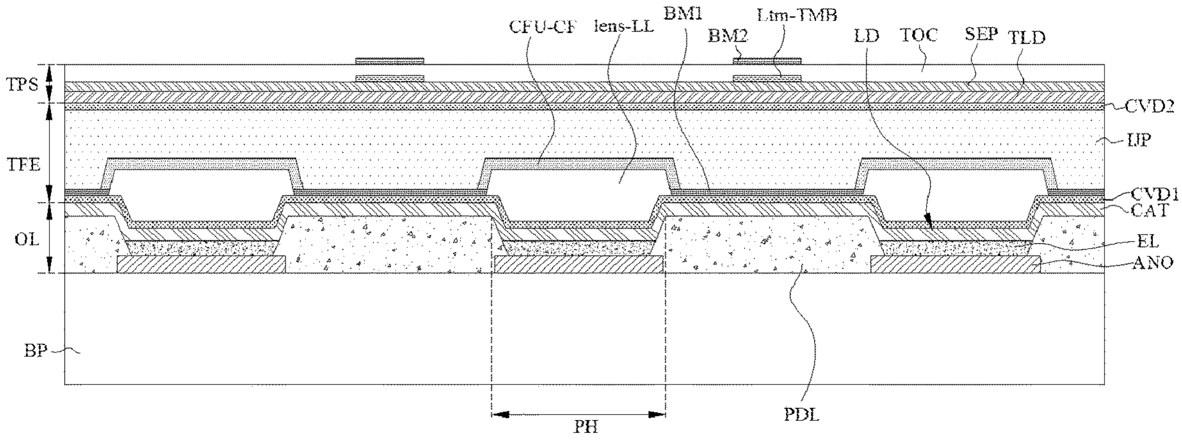
FIG. 8 is a schematic diagram of a display panel according to a fourth implementation of the present disclosure.

The following is an exemplary description of the light-absorbing structure:

In some implementations of the present disclosure, as shown in FIG. 8, the display panel further includes a light-absorbing layer BM1, which may be arranged on the same side of the driving backplane BP as the light-emitting devices LD. The orthographic projection of the light-absorbing layer BM1 on the driving backplane BP separates the orthographic projections of lenses on the driving backplane BP, so that the area other than the lenses may be shielded without affecting the light emission by the lenses.

In an implementation of the present disclosure, the light-absorbing layer BM1 and the first electrodes ANO may be arranged on the same surface of the driving backplane BP, and the pixel definition layer PDL may cover the light-absorbing layer BM1.

In an implementation of the present disclosure, the light-absorbing layer BM1 may be arranged on the surface of the pixel definition layer PDL away from the driving backplane BP, and expose the openings PH.

Figure 10:
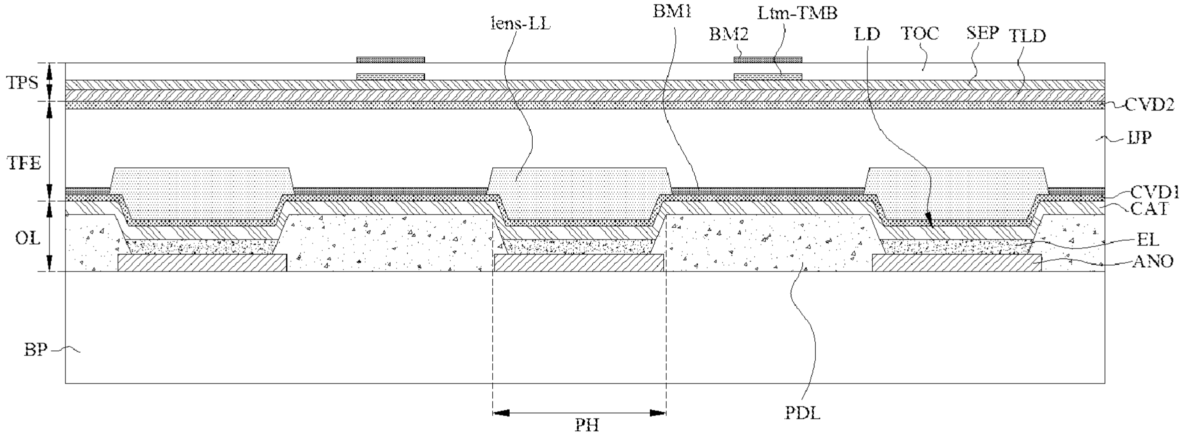
FIG. 10 is a schematic diagram of a display panel according to a sixth implementation of the present disclosure.

In an implementation of the present disclosure, as shown in FIG. 8 and FIG. 10, the light-absorbing layer BM1 may also be arranged on the surface of the first inorganic layer CVD1 away from the driving backplane BP. The organic layer IJP covers the light-absorbing layer BM1. In this way, the light-absorbing layer BM1 may be integrated into the encapsulation layer TFE, which is beneficial to avoid excessively increasing the thickness of the display panel. As shown in FIG. 8, for the scheme using the filter units CFU, at least a part of the filter units CFU may be arranged on the surface of the light-absorbing layer BM1 away from the driving backplane BP and cover the lenses. As shown in FIG. 10, the lenses are made of a filter material, and the light-absorbing layer BM1 may separate the lenses.

Certainly, the light-absorbing layer BM1 may also be arranged on other positions such as the surface of the second inorganic layer CVD2 away from the driving backplane BP, as long as it can absorb light and does not shield the light-emitting devices LD.

Figure 9:
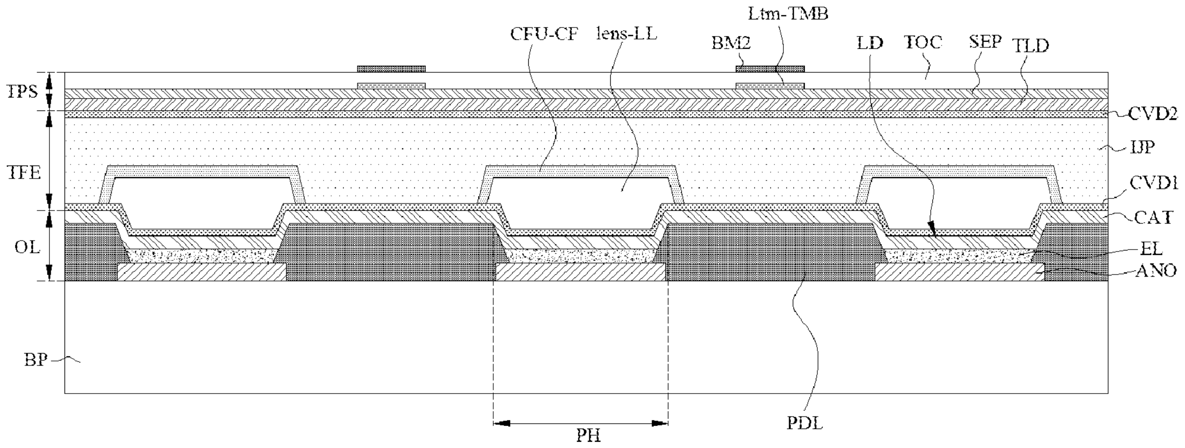
FIG. 9 is a schematic diagram of a display panel according to a fifth implementation of the present disclosure.

In other implementations of the present disclosure, as shown in FIG. 9, the display panel may not be provided with the above-mentioned light-absorbing layer BM1, and the pixel definition layer PDL may be made of a light-absorbing material, and the pixel definition layer PDL may be used as a light-absorbing structure. Thus, the pixel definition layer PDL it may absorb ambient light and may ensure normal light emission of the display panel, and this may avoid increasing the thickness of the display panel.

Figure 11:
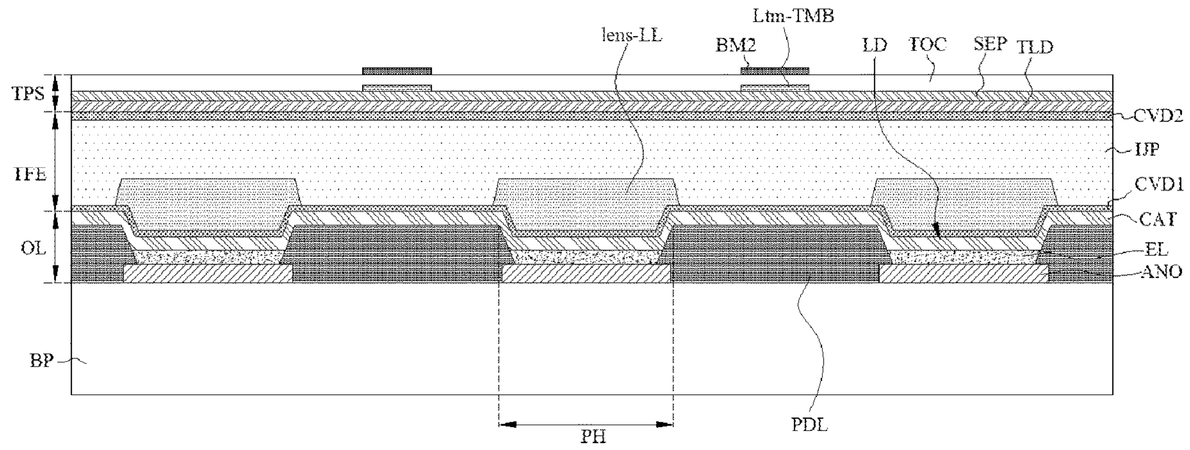
FIG. 11 is a schematic diagram of a display panel according to a seventh implementation of the present disclosure.

In addition, as shown in FIG. 11, in other implementations of the present disclosure, the pixel definition layer PDL made of light-absorbing material and the lenses made of filter material may be used, so that the filter layer CF and the light-absorbing layer BM 1 do not need to be provided.

The display panel of the present disclosure may be used to realize under-screen camera and under-screen fingerprint recognition.

Figure 13:
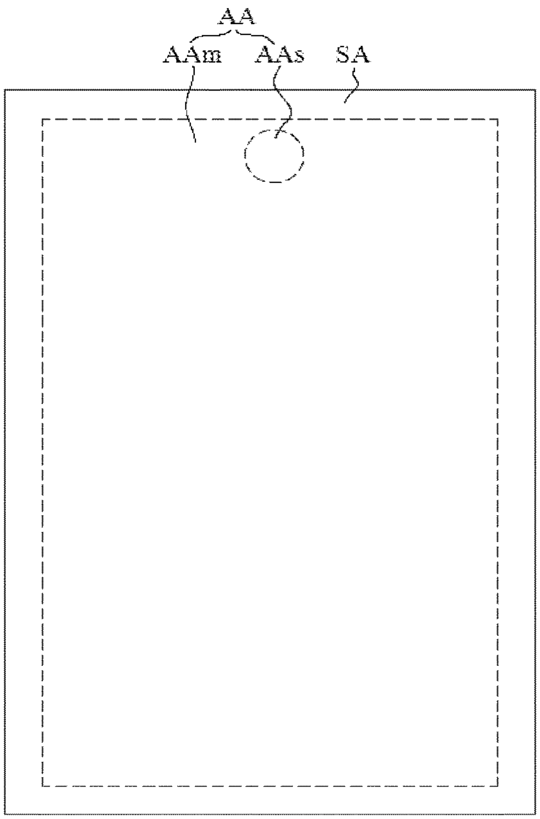
FIG. 13 is a schematic diagram of a display area and a peripheral area of a display panel of the present disclosure.

The manner of realizing under-screen camera may include but not limited to the following implementations:

In some implementations of the present disclosure, as shown in FIG. 13, the pixel definition layer PDL may be made of a light-transmitting material, and the display area AA of the display panel may be divided into at least a main display area AAm and a sub-display area AAs. The range of the main display area AAm may be larger than the sub-display area AAs, and may surround the sub-display area AAs, and the positions and shapes of the main display area AAm and sub-display area AAs are not specifically limited here. The above-mentioned light-emitting devices LD are distributed in the main display area AAm and the sub-display area AAs, and the light transmittance of the sub-display area AAs may be greater than that of the main display area AAm, so that the sub-display area AAs may only be used as an area for taking pictures under the screen. The side of the driving backplane BP away from the light-emitting layer OL may be provided with a camera corresponding to the sub-display area AAs to capture images through the sub-display area AAs, and the sub-display area AAs may display images.

There are many ways to realize that the light transmittance of the sub-display area AAs is greater than that of the main display area AAm. For example, in some implementations of the present disclosure, the density of the light-emitting devices LD in the sub-display area AAs may be made smaller than that of the main display area AAm. Correspondingly, the density of the pixel circuits located in the sub-display area AAs is also smaller than the density of the pixel circuits in the main display area AAm, thereby increasing the light-transmissible area (no pixel circuits and light-emitting devices LD) in the sub-display area AAs to increase the light transmittance.

In other implementations of the present disclosure, the number of pixel circuits in the sub-display area AAs may be reduced, for example, no pixel circuits are provided in the sub-display area AAs; however, there are still light-emitting devices LD in the sub-display area AAs. At the same time, at least part of the pixel circuits in the main display area AAm may be compressed, and pixel circuits may be arranged in the newly added space after compression, and these pixel circuits may be connected to the light-emitting devices LD in the sub-display area AAs through wires. In other words, the pixel circuits in the sub-display area AAs are transferred to the main display area AAm, so as to improve the shielding of light by the sub-display area AAs and increase the light transmittance of the sub-display area AAs.

Figure 14:
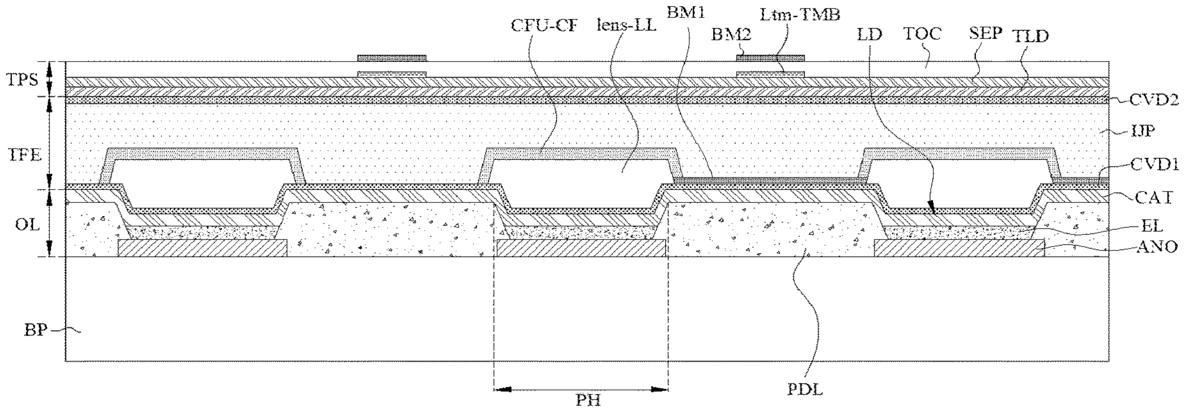
FIG. 14 is a schematic diagram of a display panel according to a ninth implementation of the present disclosure.

Based on any of the above-mentioned implementations for realizing transparent display, as shown in FIG. 14, in order to ensure that the sub-display area AAs can transmit light, the light-absorbing layer BM1 may be arranged in the main display area AAm, while in the sub-display area AAs, there may be no light-absorbing layer BM1, so as to prevent the light-absorbing layer BM1 from hindering image capture of the camera device.

Figure 15:
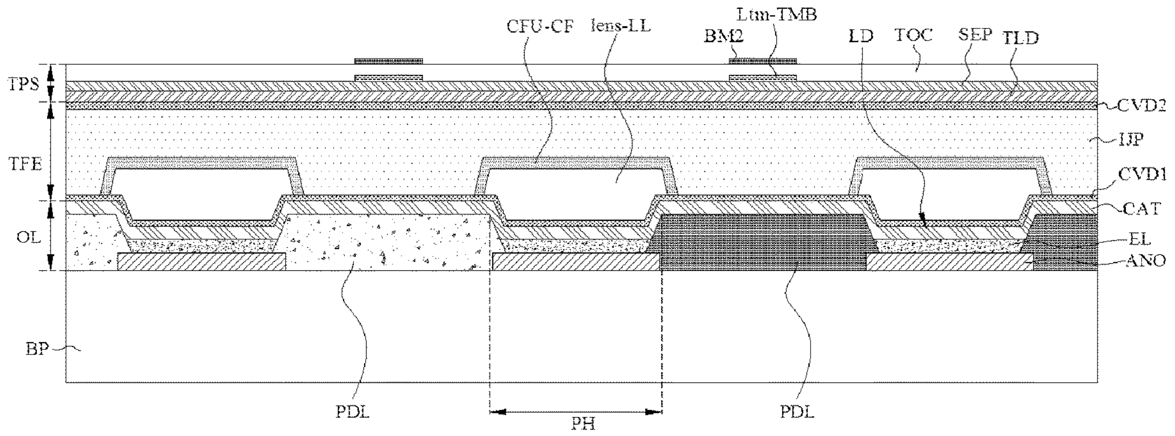
FIG. 15 is a schematic diagram of a display panel according to a tenth implementation of the present disclosure.

Of course, in other implementations of the present disclosure, as shown in FIG. 15, the light-absorbing layer BM1 may not be provided, but the pixel definition layer PDL in the main display area AAm is made of a light-absorbing material, and the pixel definition layer PDL in the sub-display area AAs is a light-transmitting material, so that the light transmittance of the sub-display area AAs is greater than that of the main display area AAm.

The manner for realizing under-screen fingerprint recognition includes but is not limited to the following implementations:

As shown in FIG. 13, the display area AA of the display panel may be divided into at least the main display area AAm and the sub-display area AAs. The range of the main display area AAm may be larger than the sub-display area AAs, and may surround the sub-display area AAs. The positions and shapes of the main display area AAm and the sub-display area AAs are not specifically limited here. A photoelectric sensing device corresponding to the sub-display area AAs may be arranged in the driving backplane BP or on a side of the substrate away from the light-emitting layer OL.

Figure 16:
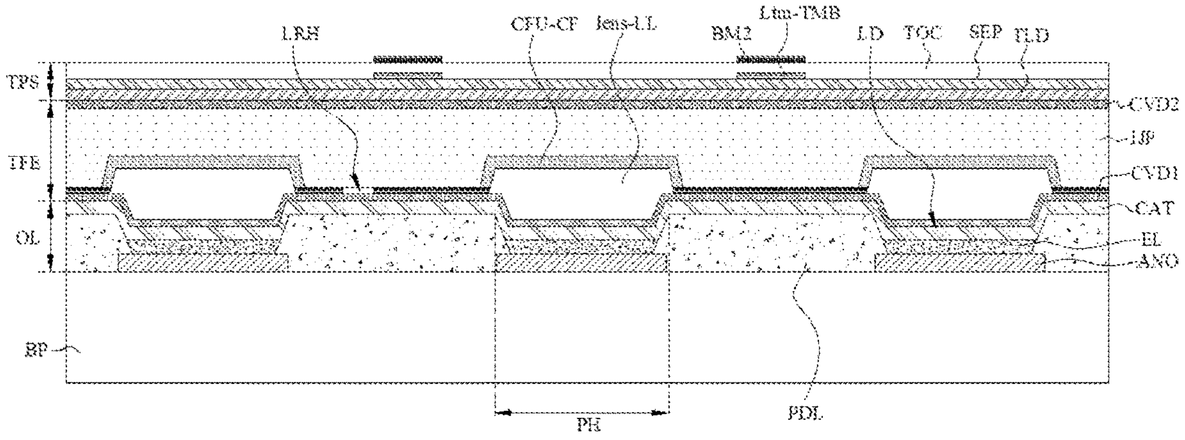
FIG. 16 is a schematic diagram of a display panel according to an eleventh implementation of the present disclosure.

In some implementations of the present disclosure, as shown in FIG. 16, the pixel definition layer PDL is made of a light-transmitting material, and the sub-display area AAs may be used as an area for fingerprint recognition. The light-absorbing layer BM1 may be distributed in the main display area AAm and the sub-display area. area AAs, and a plurality of light-transmitting holes LRH may be set in the light-absorbing layer BM1 in the sub-display area AAs. When a finger touches the sub-display area AAs, the valleys and ridges of the fingerprint may reflect light, and small-hole imaging may be performed through the light-transmitting holes LRH. The valley and ridge image is formed on the photoelectric sensing device, and after photoelectric conversion, the fingerprint information may be determined. At the same time, the sub-display area AAs may also display images, so as to realize fingerprint recognition under the screen.

Figure 17:
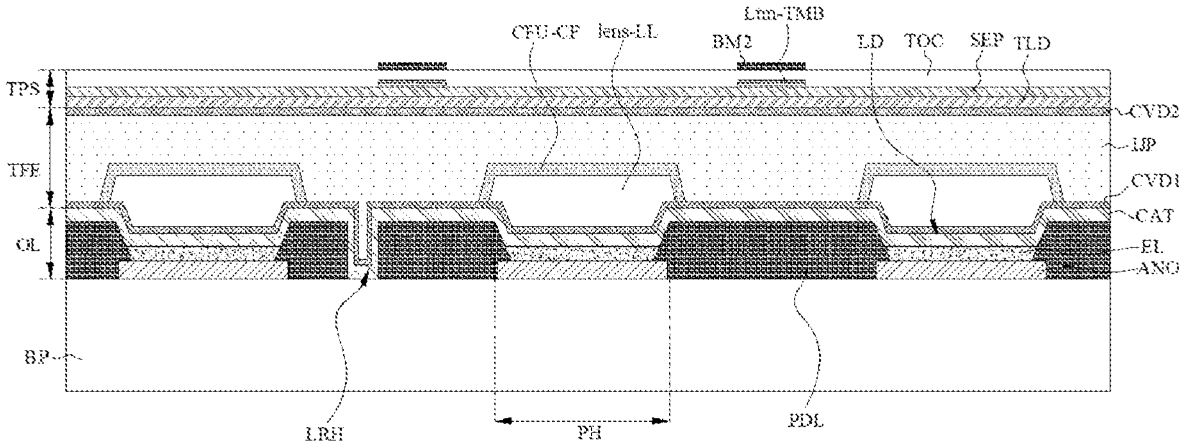
FIG. 17 is a schematic diagram of a display panel according to a twelfth implementation of the present disclosure.

In other implementations of the present disclosure, as shown in FIG. 17, the pixel definition layer PDL is a light-absorbing material, and is distributed in the main display area AAm and the sub-display area AAs. Also, the pixel definition layer PDL in the sub-display area AAs may be provided with light-transmitting holes LRH for small-hole imaging for fingerprint recognition. Since the functions of light-shielding and fingerprint recognition may be realized through the pixel definition layer PDL, it is not necessary to set the light-absorbing layer BM1. Meanwhile, the second electrode CAT and the first inorganic layer CVD 1 may be recessed at the light transmission holes LRH.

In addition, the display panel may not have the above-mentioned functions of under-screen camera and under-screen fingerprint recognition, and the display area AA may not be divided into the main display area AAm and the sub-display area AAs. Correspondingly, in some implementations of the present disclosure, as shown in FIG. 8, the light-absorbing layer BM1 may be distributed in the display area AA without providing the light-transmitting holes LRH. The pixel definition layer PDL may be a light-absorbing material or a light-transmitting material, which is not specifically limited here. In another implementation of the present disclosure, as shown in FIG. 9, the display panel is not provided with a light-absorbing layer BM1, and the pixel definition layer PDL is made of a light-absorbing material.

In some implementations of the present disclosure, in order to further reduce the reflection of ambient light, the touch electrode layer TMB may be shielded to avoid blocking the light-emitting devices LD from emitting light. For example, the channel lines Ltm of the touch electrode layer TMB may be shielded by the light-shielding layer BM2. The light-shielding layer BM2 may be made of a light-absorbing material, which may be the same as the above-mentioned light-absorbing layer BM1. The orthographic projection of the light-shielding layer BM2 on the driving backplane BP and the orthographic projections of the channel lines Ltm on the driving backplane BP at least partially overlap, and the orthographic projection of the light-shielding layer BM2 on the driving backplane BP and the orthographic projections of the holes TH on the driving backplane BP at most partially overlap. That is to say, the light-shielding layer BM2 may form shielding lines corresponding to the channel lines Ltm, and the shielding lines and the channel lines Ltm are correspondingly arranged in the direction perpendicular to the driving backplane BP, and the light-shielding layer BM2 is located on a side of the touch electrode layer TMB away from the driving backplane BP. For example:

As shown in FIG. 12, the light-shielding layer BM2 may directly cover the channel lines Ltm, and extend along the trajectories of the channel lines Ltm. The light emitted by the light-emitting devices LD may continue to exit from the holes TH. The protective layer TOC covers the light-shielding layer BM2. If other film layer, such as a cover plate, is to be arranged on the side of the light-shielding layer BM2 away from the driving backplane BP, a planarization layer may be used to cover the light-shielding layer BM2, and other film layer is arranged on the planarization layer. Alternatively, as shown in FIG. 7 to FIG. 11, the light-shielding layer BM2 may be arranged on the surface of the protective layer TOC away from the driving backplane BP, and correspond to the channel lines Ltm, as long as it can shield the channel lines Ltm.

As shown in FIG. 16 and FIG. 17, the light-transmitting holes LRH may be shielded by the channel lines Ltm and the light-shielding layer BM2, which may affect fingerprint recognition. Thus, the orthographic projections of the channel lines Ltm on the driving backplane BP may be spaced from the orthographic projections of the light-transmitting holes LRH on the driving backplane BP, i.e., there is no overlapping area, so as to prevent the channel lines Ltm from shielding the light-transmitting holes LRH. The orthographic projection of the light-shielding layer BM2 on the driving backplane BP may be spaced from the orthographic projections of the light-transmitting holes LRH on the driving backplane BP, i.e., there is no overlapping area, so as to prevent the light-shielding layer BM2 from shielding the light-transmitting holes LRH.

Figure 21:
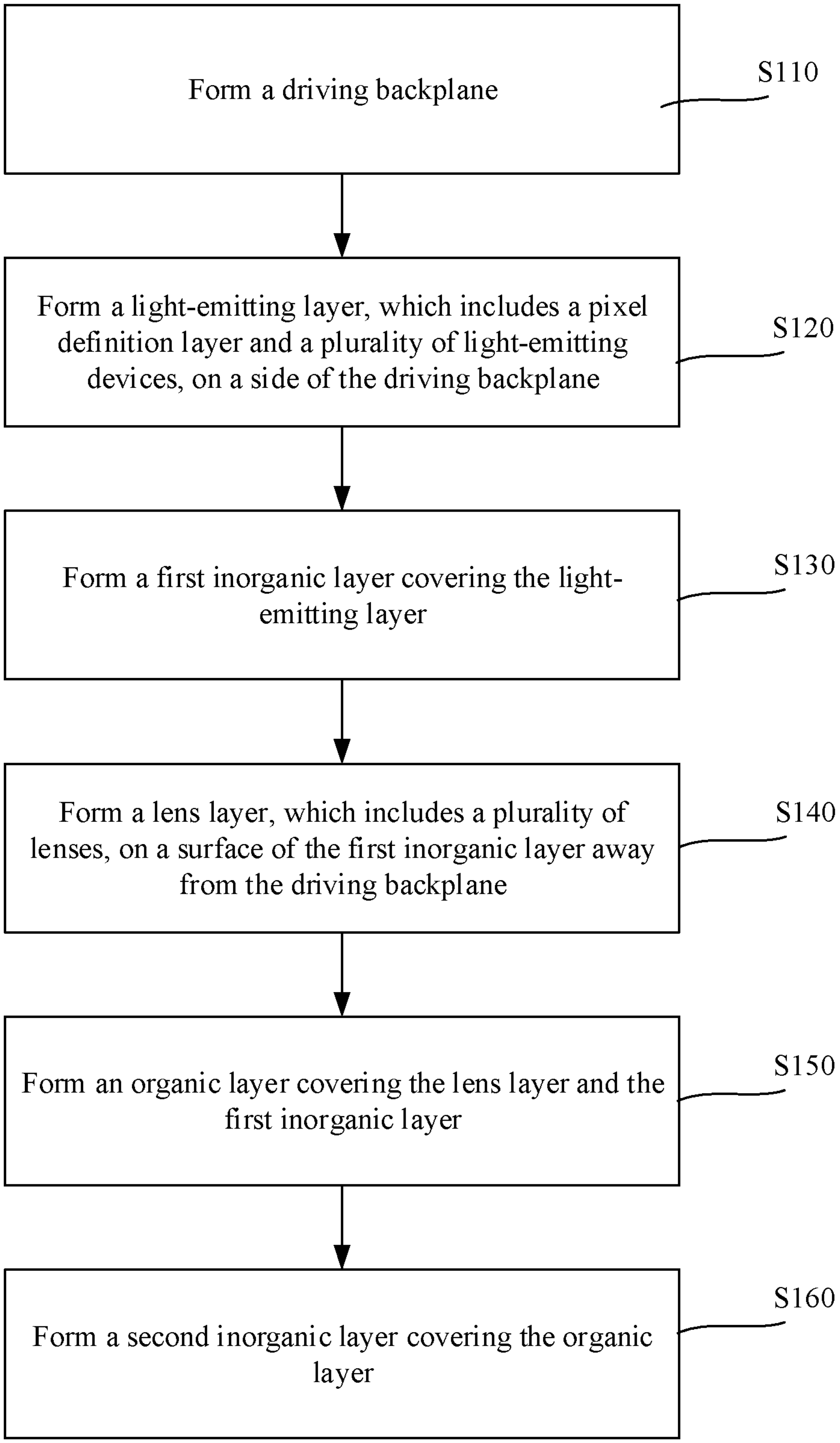
FIG. 21 is a flowchart of a method for manufacturing a display panel according to an implementation of the present disclosure.

The present disclosure provides a method for manufacturing a display panel, and the display panel may be the display panel in any one of the above implementations. The manufacturing method may include step S110 to step S160, as shown in FIG. 21.

In step S110, a driving backplane is formed.

In step S120, a light-emitting layer, which includes a pixel definition layer and a plurality of light-emitting devices, is formed on a side of the driving backplane. The pixel definition layer has a plurality of openings, and one of the light-emitting devices is defined in one of the openings.

In step S130, a first inorganic layer covering the light-emitting layer is formed.

In step S140, a lens layer, which includes a plurality of lenses, is formed on a surface of the first inorganic layer away from the driving backplane. One of the lenses and one of the light-emitting devices are arranged correspondingly.

In step S150, an organic layer covering the lens layer and the first inorganic layer is formed. A refractive index of the organic layer is smaller than a refractive index of the first inorganic layer and smaller than a refractive index of the lens.

In step S160, a second inorganic layer covering the organic layer is formed.

It is to be noted that although the individual steps of the manufacturing method in the present disclosure are depicted in the accompanying drawings in a particular order, it is not required or implied that the steps need be performed in that particular order or that all of the steps shown need be performed to achieve the desired result. Additional or alternatively, certain steps may be omitted, multiple steps may be combined into one step, and/or one step may be broken down into multiple steps, etc.

Regarding the details in other steps of the above-mentioned manufacturing method and the beneficial effects of the manufacturing method, reference may be made to the above implementations of the display panel, and repeated description will be omitted here.

The present disclosure also provides a display device, and the display device may include the display panel in any of the foregoing implementations. The display panel is a display panel in any of the above-mentioned implementations, and regarding its specific structures and beneficial effects, reference may be made to the above-mentioned implementations of the display panel, and repeated descriptions will be omitted here. The display device of the present disclosure may be an electronic device with a display function such as a mobile phone, a tablet computer, or a television, and will not be listed here.

Other implementations of the present disclosure will be readily apparent to those skilled in the art from consideration of the specification and practice of the invention disclosed herein. This application is intended to cover any modification, use or adaptation of the present disclosure, and such modifications, uses or adaptations follow the general principles of the present disclosure and include common knowledge or conventional technical means in the technical field not disclosed in the present disclosure. The specification and embodiments are to be considered exemplary only, with the true scope and spirit of the present disclosure defined by the appended claims.

What is claimed is:

1. A display panel, comprising:

a driving backplane;

a light-emitting layer arranged on a side of the driving backplane and comprising a pixel definition layer and a plurality of light-emitting devices, wherein the pixel definition layer has a plurality of openings, and one of the light-emitting devices is defined in one of the openings;

a first inorganic layer covering the light-emitting layer;

a lens layer arranged on a surface of the first inorganic layer away from the driving backplane, and comprising a plurality of lenses, wherein one of the lenses and one of the light-emitting devices are arranged correspondingly;

an organic layer covering the lens layer and the first inorganic layer, wherein the organic layer is a planarization layer, and a refractive index of the organic layer is smaller than a refractive index of the first inorganic layer and smaller than a refractive index of the lenses; and a second inorganic layer covering the organic layer.

2. The display panel according to claim 1, further comprising:

a filter layer covering the lens layer and comprising a plurality of filter units distributed in an array, wherein any one of at least a part of the lenses is covered by one of the filter units, each of the filter units only allows monochromatic light to pass through, and colors of monochromatic light passing through at least two of the filter units are different, and a refractive index of the filter layer is smaller than a refractive index of a lens which is covered by the filter layer.

3. The display panel according to claim 2, wherein the refractive index of the organic layer is the same as the refractive index of the filter layer.

4. The display panel according to claim 2, further comprising:

a light-absorbing layer arranged on a surface of the first inorganic layer away from the driving backplane;

wherein at least a part of the filter units are arranged on a surface of the light-absorbing layer away from the driving backplane and cover the lenses.

5. The display panel according to claim 1, wherein at least a part of the lenses only allow monochromatic light to pass through, and colors of monochromatic light passing through at least two of the lenses are different, and the refractive index of the organic layer is smaller than the refractive index of the lenses.

6. The display panel according to claim 1, wherein the refractive index of the lenses is the same as the refractive index of the first inorganic layer.

7. The display panel according to claim 1, wherein the first inorganic layer is recessed at the openings to form recesses, and each of the lenses comprises a filling portion filling one of the recesses and a protrusion portion protruding from the one of the recesses.

8. The display panel according to claim 7, wherein the protrusion portion has a top surface and an outer peripheral surface surrounding the top surface, and the outer peripheral surface is connected between the top surface and the filling portion;

wherein in one of the lenses and a recess which the one of the lenses fills, an orthographic projection of an opening corresponding to the recess on the driving backplane is located within an orthographic projection of the top surface on the driving backplane, the outer periphery surface shrinks in a direction away from the driving backplane, and an orthographic projection of the outer peripheral surface on the driving backplane surrounds outside of the orthographic projection of the opening corresponding to the recess on the driving backplane.

9. The display panel according to claim 8, wherein the outer peripheral surface is formed by a plurality of surrounding planes, and each of the planes is an inclined slope, and a slope angle of each of the planes is not greater than 90°.

10. The display panel according to claim 1, further comprising:

a light-absorbing layer arranged on a same side of the driving backplane as the light-emitting devices, wherein an orthographic projection of the light-absorbing layer on the driving backplane separates orthographic projections of the lenses on the driving backplane.

11. The display panel according to claim 10, wherein the display panel comprises a display area and a peripheral area located outside the display area, the display area has a sub-display area and a main display area located outside the sub-display area, the light-emitting devices are distributed in the main display area and the sub-display area, and the light-absorbing layer is located in the main display area.

12. The display panel according to claim 10, wherein the display panel comprises a display area and a peripheral area located outside the display area, the display area has a sub-display area and a main display area located outside the sub-display area, and the light-emitting devices are distributed in the main display area and the sub-display area;

wherein the display panel further comprises:

the light-absorbing layer arranged in the main display area and the sub-display area, wherein the light-absorbing layer is provided with a plurality of light transmission holes located in the sub-display area.

13. The display panel according to claim 1, wherein at least a part of the pixel definition layer is made of a light-absorbing material.

14. The display panel according to claim 13, wherein the display panel comprises a display area and a peripheral area located outside the display area, the display area has a sub-display area and a main display area located outside the sub-display area, and the light-emitting devices are distributed in the main display area and the sub-display area;

wherein the pixel definition layer in the sub-display area is made of a light-transmitting material, and the pixel definition layer in the main display area is made of the light-absorbing material.

15. The display panel according to claim 13, wherein the display panel comprises a display area and a peripheral area located outside the display area, the display area has a sub-display area and a main display area located outside the sub-display area, and the light-emitting devices are distributed in the main display area and the sub-display area;

wherein the pixel definition layer is made of the light-absorbing material, and the pixel definition layer in the sub-display area is provided with a light-transmitting hole.

16. The display panel according to claim 1, further comprising:

a touch electrode layer arranged on a side of the second inorganic layer away from the driving backplane, wherein the touch electrode layer is a mesh structure with a plurality of holes formed by a plurality of connected channel lines; and a light-shielding layer arranged on a side of the touch electrode layer away from the driving backplane, wherein an orthographic projection of the light-shielding layer on the driving backplane and orthographic projections of the channel lines on the driving backplane at least partially overlap, and the orthographic projection of the light-shielding layer on the driving backplane and orthographic projections of the holes on the driving backplane at most partially overlap.

17. A method for manufacturing a display panel, comprising:

forming a driving backplane;

forming a light-emitting layer, which comprises a pixel definition layer and a plurality of light-emitting devices, on a side of the driving backplane, wherein the pixel definition layer has a plurality of openings, and one of the light-emitting devices is defined in one of the openings;

forming a first inorganic layer covering the light-emitting layer;

forming a lens layer, which comprises a plurality of lenses, on a surface of the first inorganic layer away from the driving backplane, wherein one of the lenses and one of the light-emitting devices are arranged correspondingly;

forming an organic layer covering the lens layer and the first inorganic layer, wherein the organic layer is a planarization layer, and a refractive index of the organic layer is smaller than a refractive index of the first inorganic layer and smaller than a refractive index of the lenses; and forming a second inorganic layer covering the organic layer.

18. A display device, comprising a display panel;

wherein the display panel comprises:

a driving backplane;

a light-emitting layer arranged on a side of the driving backplane and comprising a pixel definition layer and a plurality of light-emitting devices, wherein the pixel definition layer has a plurality of openings, and one of the light-emitting devices is defined in one of the openings;

a first inorganic layer covering the light-emitting layer;

a lens layer arranged on a surface of the first inorganic layer away from the driving backplane, and comprising a plurality of lenses, wherein one of the lenses and one of the light-emitting devices are arranged correspondingly;

an organic layer covering the lens layer and the first inorganic layer, wherein the organic layer is a planarization layer, and a refractive index of the organic layer is smaller than a refractive index of the first inorganic layer and smaller than a refractive index of the lenses; and a second inorganic layer covering the organic layer.

19. The display device according to claim 18, wherein the display panel further comprises:

a filter layer covering the lens layer and comprising a plurality of filter units distributed in an array, wherein any one of at least a part of the lenses is covered by one of the filter units, each of the filter units only allows monochromatic light to pass through, and colors of monochromatic light passing through at least two of the filter units are different, and a refractive index of the filter layer is smaller than a refractive index of a lens which is covered by the filter layer.

20. The display device according to claim 19, wherein the refractive index of the organic layer is the same as the refractive index of the filter layer.

* * * * *